(12) United States Patent
Hashitani et al.

(10) Patent No.: US 6,889,163 B2
(45) Date of Patent: May 3, 2005

(54) SYSTEM AND METHOD FOR ASSESSING ENVIRONMENTAL LOAD

(75) Inventors: Takafumi Hashitani, Kawasaki (JP); Sachio Ido, Kawasaki (JP); Tsuyoshi Mita, Kawasaki (JP); Shigeharu Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/463,850

(22) Filed: Jun. 18, 2003

(65) Prior Publication Data

US 2004/0039529 A1 Feb. 26, 2004

(30) Foreign Application Priority Data

Jun. 21, 2002 (JP) ........................................ 2002-181744
Sep. 20, 2002 (JP) ........................................ 2002-275576

(51) Int. Cl.⁷ ........................... G06F 11/30; G21C 17/00
(52) U.S. Cl. ....................................................... 702/182
(58) Field of Search ............................. 702/57, 80, 117, 702/118, 155, 156, 173, 182, 188, 189; 707/6, 104.1

(56) References Cited

U.S. PATENT DOCUMENTS 6,532,464 B1 * 3/2003 Miyamoto .................... 707/10

FOREIGN PATENT DOCUMENTS

| JP | 7-311760 | 11/1995 |
|----|----------|---------|
| JP | 10-198719 | 7/1998 |
| JP | 2000-553 | 1/2000 |

* cited by examiner

*Primary Examiner*—Michael Nghiem
(74) *Attorney, Agent, or Firm*—Staas & Halsey LLP

(57) ABSTRACT

A system for assessing an environmental load includes an image acquisition unit which acquires image data of an image of a component-implemented circuit board subjected to assessment, a component database which includes matching-purpose data and environmental load data with respect to a plurality of components, and a matching unit which matches the image data with the matching-purpose data of the component database to identify individual components on the component-implemented circuit board subjected to assessment, and extracts the environmental load data belonging to the identified individual components from the component database, thereby obtaining the environmental load of the component-implemented circuit board subjected to assessment.

28 Claims, 23 Drawing Sheets

FIG.5
| NAME | WEIGHT (g) | LENGTH (mm) | WIDTH (mm) | THICKNESS (mm) | PATTERN | MANUFACTURER | ELECTRIC POWER (kWh) | COPPER (kg) | CALORIFIC VALUE (MJ) | CO$_2$ (kg) | Nox (g) |
|---|---|---|---|---|---|---|---|---|---|---|---|
| A7A266 | 156 | 250 | 150 | 1.5 |  | SAS | 12 (76.7kWh/kg) | 0.071 (0.458kg/kg) | 149 (955MJ/kg) | 9.2 (58.7kg/kg) | 8.9 (57g/kg) |
| A7V266 | 162 | 270 | 160 | 1.6 |  | SAS | 15 (92.6kWh/kg) | 0.081 (0.5kg/kg) | 161 (933MJ/kg) | 10.5 (64.8kg/kg) | 9.1 (56g/kg) |
| CUPLE-VM | 152 | 230 | 155 | 1.3 |  | SAS | 10 (65.8kWh/kg) | 0.065 (0.42kg/kg) | 136 (895MJ/kg) | 7.8 (51.3kg/kg) | 6.5 (43g/kg) |
| ... | | | | | | | ... | ... | ... | ... | ... |

FIG.6

| DEVICE | No. | TYPE | COLOR | PATTERN | LENGTH (mm) | HEIGHT (mm) | WIDTH (mm) | ELECTRIC POWER (mm) | COPPER (kg) | CALORIFIC VALUE (MJ) | $CO_2$ (g) | Nox (g) | MASS (g) |
|---|---|---|---|---|---|---|---|---|---|---|---|---|---|
| LOGIC | 1 | F10001 | | | 10 | 5 | 1.5 | 0.6 | 0.002 | 1.3 | 8 | 0.3 | 2.3 |
| | 2 | N10002 | | | 8 | 8 | 1.2 | 0.6 | 0.001 | 1 | 7 | 0.2 | 2.2 |
| | ... | | | | ... | ... | ... | ... | ... | ... | ... | ... | ... |
| MEMORY | 1 | T20001 | | | 5 | 3 | 1.2 | 0.7 | 0.001 | 1.1 | 6 | 0.15 | 1.9 |
| | 2 | H20002 | | | 7 | 3 | 1.3 | 0.8 | 0.002 | 1.2 | 5 | 0.23 | 2.1 |
| | ... | | | | ... | ... | ... | ... | ... | ... | ... | ... | ... |
| RESISTOR | 1 | | | | 5 | 1.2 | 1.2 | 0.01 | 0.0002 | 0.01 | 0.1 | 0.02 | 0.005 |
| | 2 | | | | 7 | 1.3 | 1.3 | 0.02 | 0.0003 | 0.02 | 0.2 | 0.03 | 0.008 |
| | ... | | | | ... | ... | ... | ... | ... | ... | ... | ... | ... |
| CONDENSER | 1 | | | | 3 | 1.5 | 1.3 | 0.01 | 0.0002 | 0.006 | 0.1 | 0.01 | 0.007 |
| | 2 | | | | 2 | 3 | 2 | 0.02 | 0.0002 | 0.005 | 0.05 | 0.007 | 0.006 |
| | ... | | | | ... | ... | ... | ... | ... | ... | ... | ... | ... |
| CONNECTOR | 1 | | | | 100 | 12 | 10 | 0.05 | 0.002 | 0.007 | 10 | 0.8 | 3.5 |
| | 2 | | | | 80 | 10 | 9 | 0.07 | 0.001 | 0.006 | 8 | 0.3 | 3.8 |
| | ... | | | | ... | ... | ... | ... | ... | ... | ... | ... | ... |

FIG.7

| | INVENTORY ITEM | | NAME | UNIT | FMV-6750NA8/L CIRCUIT BOARD COMPONENTS | | | ELECTRONIC DEVICE |
|---|---|---|---|---|---|---|---|---|
| | | No | NAME | | LOGIC 1 | LOGIC 2 | ... | |
| ITEMS CONSUMED AS RESOURCES | ENERGY CONSUMPTION | | | MJ | 1.098E+01 | 9.544E+00 | ... | 7.922E+02 |
| | | | | Mcal | 2.621E+00 | 2.279E+00 | ... | 1.892E+02 |
| | COAL | 1 | RAW MATERIAL (COKE) + ELECTRIC POWER | kg | | | ... | 4.310E+00 |
| | CRUDE OIL (FUEL) | 2 | oil r | kg | 5.972E-02 | 5.193E-02 | ... | 9.755E+00 |
| | NG | 3 | LNG reserves kg | kg | 1.352E-01 | 1.175E-01 | ... | 2.229E+00 |
| | URANIUM ORE | 4 | U reserves | kg | 3.088E-02 | 2.685E-02 | ... | 2.870E-04 |
| | CRUDE OIL (RAW MATERIAL) | | | kg | 3.977E-06 | 3.458E-06 | ... | 3.250E-01 |
| | IRON ORE | 5 | reserves+scrup | kg | 4.503E-03 | 3.916E-03 | ... | |
| | COPPER ORE | 6 | reserves+scrup | kg | 4.653E-03 | 4.450E-02 | ... | 3.358E-01 |
| | BAUXITE | 7 | reserves+scrup | kg | | | ... | |
| | NICKEL ORE | 8 | ORE(reserves)+mad | kg | | | ... | |
| | CHROMIUM ORE | 9 | Cr reserves | kg | | | ... | |
| | MANGANESE ORE | 10 | Mn reserves | kg | | | ... | |
| | CRYOLITE $CaF_2$ | 11 | fluorite (CRYOLITE, $CaF_2$) | kg | | | ... | |
| | LIMESTONE | 12 | limestone (LIMESTONE) | kg | 4.838E-03 | 4.628E-02 | ... | 3.492E-01 |
| | HALITE | 13 | NaCl | kg | 5.728E-03 | 5.479E-02 | ... | 4.734E-01 |
| | SILICASAND | 14 | silicasand | kg | 3.302E-03 | 3.158E-02 | ... | 2.383E-01 |
| | TIMBER | 15 | TIMBER+used paper | kg | 6.928E-06 | 6.627E-05 | ... | 5.000E-04 |
| | WATER | 16 | HYDRAULIC POWER + PROCESS + COOLANT | kg | 5.452E+01 | 5.215E+02 | ... | 3.935E+03 |
| ITEMS RELEASED TO THE AIR | $CO_2$ | 1 | $CO_2$ | kg | 6.815E-01 | 6.519E+00 | ... | 4.919E+01 |
| | SOx | 2 | $SO_2$+SOx | kg | 4.572E-04 | 4.373E-03 | ... | 3.300E-02 |
| | NOx | 3 | NOx | kg | 7.607E-04 | 7.276E-03 | ... | 5.490E-02 |
| | $N_2O$ | 4 | $N_2O$ | kg | 5.127E-05 | 4.904E-04 | ... | 3.700E-03 |
| | DUST | 5 | dust | kg | 7.482E-05 | 6.506E-05 | ... | 5.400E-03 |
| | | 6 | $CH_4$ | kg | 1.063E-05 | 9.241E-06 | ... | 7.670E-04 |
| | | 7 | CO | kg | 8.590E-05 | 7.470E-05 | ... | 6.200E-03 |
| | | 8 | CxHy | kg | 2.355E-05 | 2.048E-06 | ... | 1.700E-03 |
| | | 9 | NMVOC | kg | 2.078E-05 | 1.807E-05 | ... | 1.500E-03 |
| | WEIGHT | | | kg | 2.300E-03 | 2.000E-03 | ... | 1.500E-01 |

| parts | ENVIRONMENTAL LOAD (BEFORE ALLOCATION) | | | | | ENVIRONMENTAL LOAD (AFTER ALLOCATION) | | | | |
|---|---|---|---|---|---|---|---|---|---|---|
| | MASS(g) | ELECTRIC POWER (kWh) | ... | $CO_2$(g) | Nox(g) | MASS(g) | ELECTRIC POWER (kWh) | ... | $CO_2$(g) | Nox(g) |
| Logic1(p1) | 2.30 | 0.6 | ... | 8 | 0.30 | 2.55 | 0.66 | ... | 8.85 | 0.33 |
| Logic2(p2) | 2.00 | 0.5 | ... | 7 | 0.20 | 2.21 | 0.55 | ... | 7.75 | 0.22 |
| Logic3(p3) | 2.50 | 0.7 | ... | 8.5 | 0.32 | 2.77 | 0.77 | ... | 9.41 | 0.35 |
| Logic4(p4) | 2.10 | 0.5 | ... | 7.2 | 0.21 | 2.32 | 0.55 | ... | 7.97 | 0.23 |
| Logic5(p5) | 2.30 | 0.6 | ... | 7.3 | 0.22 | 2.55 | 0.66 | ... | 8.08 | 0.24 |
| Memory1(p6) | 3.10 | 0.8 | ... | 8.6 | 0.35 | 3.43 | 0.89 | ... | 9.52 | 0.39 |
| Memory2(p7) | 3.20 | 0.9 | ... | 8.7 | 0.36 | 3.54 | 1.00 | ... | 9.63 | 0.40 |
| R1(p8) | 0.01 | 0.01 | ... | 0.1 | 0.02 | 0.01 | 0.01 | ... | 0.11 | 0.02 |
| R2(p9) | 0.01 | 0.02 | ... | 0.2 | 0.03 | 0.01 | 0.02 | ... | 0.22 | 0.03 |
| ... | ... | ... | ... | ... | ... | ... | ... | ... | ... | ... |
| R8(p15) | 0.01 | 0.02 | ... | 0.13 | 0.03 | 0.01 | 0.02 | ... | 0.14 | 0.03 |
| C1(p16) | 0.01 | 0.02 | ... | 0.10 | 0.01 | 0.01 | 0.02 | ... | 0.11 | 0.01 |
| C2(p17) | 0.01 | 0.02 | ... | 0.05 | 0.01 | 0.01 | 0.02 | ... | 0.06 | 0.01 |
| ... | ... | ... | ... | ... | ... | ... | ... | ... | ... | ... |
| C5(p20) | 0.01 | 0.02 | ... | 0.08 | 0.01 | 0.01 | 0.02 | ... | 0.09 | 0.01 |
| CN1(p21) | 3.50 | 0.05 | ... | 10 | 0.80 | 3.87 | 0.06 | ... | 11.07 | 0.89 |
| CN2(p22) | 3.80 | 0.07 | ... | 8 | 0.30 | 4.21 | 0.08 | ... | 8.85 | 0.33 |
| BOARD(p23) | 125.00 | 0.04 | ... | 895 | 1.60 | 138.33 | 0.04 | ... | 990.47 | 1.77 |
| RECOGNIZED(A) | 150.00 | 10.60 | ... | 1085.00 | 3.16 | 166.00 | 12.00 | ... | 1200.00 | 3.50 |
| UNRECOGNIZED(B) | 16.00 | — | ... | — | — | 0.00 | — | ... | — | — |
| TOTAL(A+B) | 166.00 | — | ... | — | — | 166.00 | — | ... | — | — |

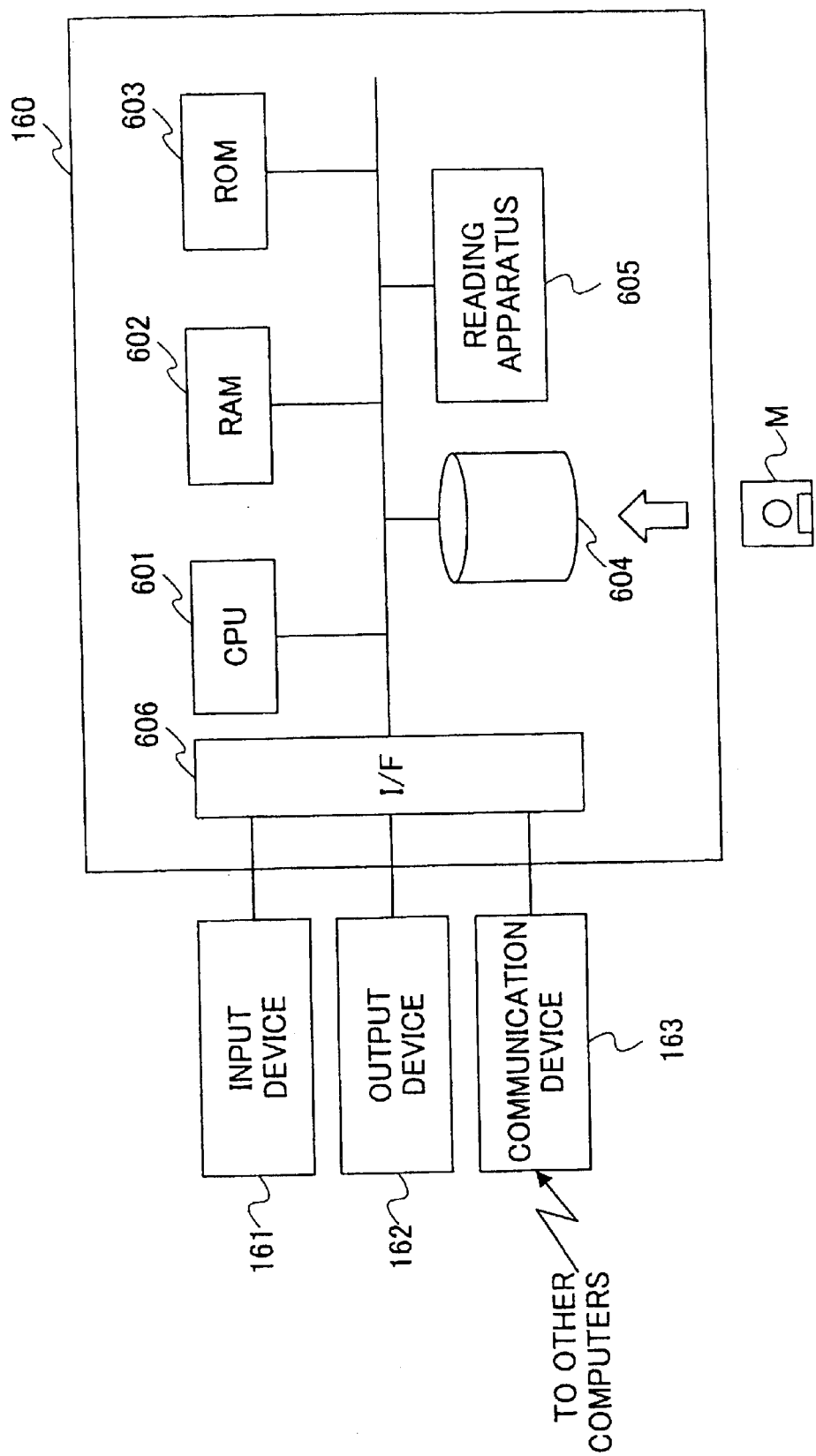

FIG.11A
| DEVICE NAME | No. | PATTERN |
|---|---|---|
| LOGIC IC | 1 |  |
|  | 2 |  |
|  | ... | ... |
| MEMORY | 1 |  |
|  | 2 |  |
|  | ... | ... |
| RESISTOR | 1 |  |
|  | 2 |  |
|  | ... | ... |
| CONDENSER | 1 |  |
|  | 2 |  |
|  | ... | ... |
FIG.11B
| DEVICE NAME | No. | PATTERN |
|---|---|---|
| CPU | 1 |  |
|  | 2 |  |
|  | ... | ... |
| COMMUNICATION | 1 |  |
|  | 2 |  |
|  | ... | ... |

1 PIXEL

MATCH  MISMATCH

MISMATCH PORTION

FIG.17
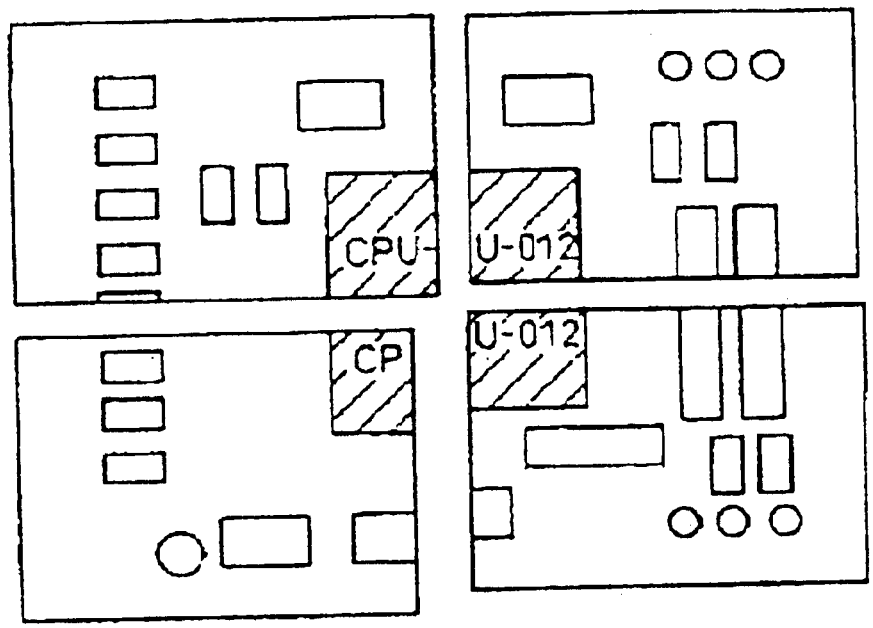
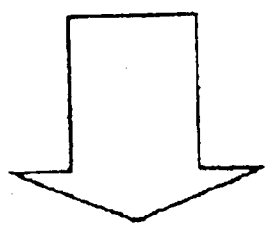
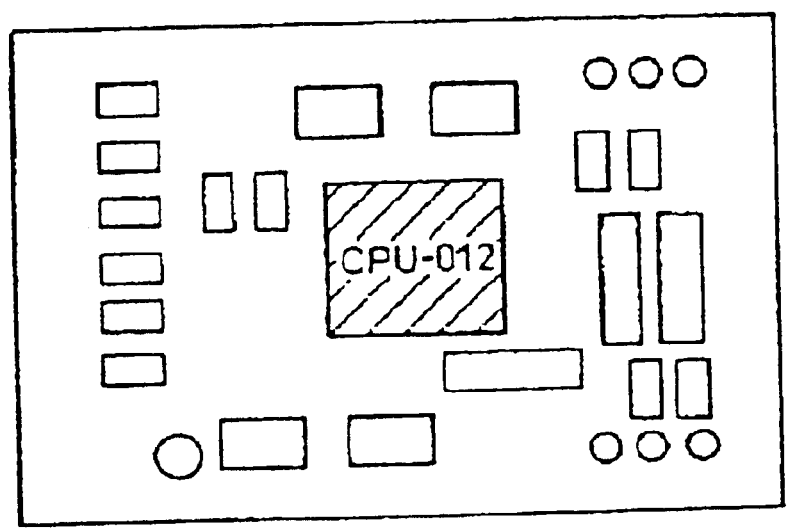

SYSTEM AND METHOD FOR ASSESSING ENVIRONMENTAL LOAD

CROSS-REFERENCE TO RELATED APPLICATIONS

The present application is based upon and claims the benefit of priority from the prior Japanese Patent Application No. 2002-181744 filed on Jun. 21, 2002, and Japanese priority application No. 2002-275576 filed on Sep. 20, 2002, with the Japanese Patent Office, the entire contents of which are incorporated herein by reference.

BACKGROUND OF THE INVENTION

1. Field of the Invention

The present invention generally relates to a system and method for assessing the load of electrical commercial products on the environment, and particularly relates to a system and method for assessing the load on the environment of circuit boards carrying electrical commercial products.

2. Description of the Related Art

The lifecycle of a commercial product from manufacture to disposal may be divided into a series of phases such as the mining and transportation of raw materials, refining of materials, manufacturing of components, the manufacturing and transportation of the product, the use, recycling, and disposal of the product. The term "lifecycle assessment" refers to the quantitative assessment of the load on the environment that takes into account all the factors relating to the consumption of energy and natural resources and the type and quantity of waste materials associated with each of the phases. As the examples of the art relating to the lifecycle assessment, Japanese Patent Application Publication No. 7-311760 discloses a method of assessing the environmental load, and Japanese Patent Application Publication No. 2000-553 discloses a method and apparatus for assessing the environmental load.

Further, Japanese Patent Application Publication No. 10-198719 discloses a method and apparatus for assessing the environmental load that generates a database in advance by identifying the relationships between the type and size of components and the environmental load of these components. Such a database is expected to reduce time and labor associated with the assessment of the environmental load of a circuit board on which circuit components are mounted. In actuality, however, it is generally unknown what components are actually implemented on the circuit board at the time of manufacturing even if the circuit components were definitely known at the time of design. Because of this, components implemented on each circuit board need to be identified through visual inspection or through document checks. The type and quantity of components manually identified in this manner are then used for the assessment of environmental load.

Such manual labor may require removing soldered components from the circuit board for inspection and size measurement so as to evaluate the type and size of the components implemented on the board. In electrical products, the more complexity the circuit attains, the larger the number of components implemented on the board. The assessment of environmental load through manual labor is time consuming and cumbersome if it has be to be done with respect to a large number of components at the time of manufacturing.

Accordingly, there is a need for a system and method for environmental load assessment that achieves automatic and speedy assessment of the environmental load of a circuit board having implemented components.

SUMMARY OF THE INVENTION

It is a general object of the present invention to provide a system and method for environmental load assessment that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a system and method for environmental load assessment particularly pointed out in the specification in such full, clear, concise, and exact terms as to enable a person having ordinary skill in the art to practice the invention.

To achieve these and other advantages in accordance with the purpose of the invention, the invention provides a system for assessing an environmental load, including an image acquisition unit which acquires image data of an image of a component-implemented circuit board subjected to assessment, a component database which includes matching-purpose data and environmental load data with respect to a plurality of components, and a matching unit which matches the image data with the matching-purpose data of the component database to identify individual components on the component-implemented circuit board subjected to assessment, and extracts the environmental load data belonging to the identified individual components from the component database, thereby obtaining the environmental load of the component-implemented circuit board subjected to assessment.

According to another aspect of the invention, the system as described above further includes a weight data acquiring unit which acquires weight data of the component-implemented circuit board subjected to assessment, and a circuit-board database which includes matching-purpose data and environmental load data with respect to a plurality of component-implemented circuit boards, wherein the matching unit performs a first matching process that matches the image data and the weight data with the matching-purpose data of the circuit-board database to identify the component-implemented circuit board as a whole, and performs a second matching process in response to a failure of the first matching process, the second matching process identifying the individual components on the component-implemented circuit board subjected to assessment.

With the system for assessing the environmental load as described above, the circuit-board database or the component database are referred to by use of the image data captured by a camera or the measured weight data so as to recognize and identify the component-implemented circuit board or the components on the board for assessment of the environmental load of the component-implemented circuit board. This makes it possible to achieve automatic and speedy assessment of the environmental load of a component-implemented circuit board used for an electrical commercial product whereas such assessment required a lengthy time and manual labor in the related art. Improvement of efficiency and reduction of costs are thus achieved in the lifecycle assessment.

Other objects and further features of the present invention will be apparent from the following detailed description when read in conjunction with the accompanying drawings.

BRIEF DESCRIPTION OF THE DRAWINGS

FIG. 5 is a drawing showing an example of a circuit board database;

FIG. 6 is a drawing showing an example of a component database;

FIG. 7 is a drawing showing an example of a table sheet;

FIG. 8 is a drawing for explaining an allocation process;

FIG. 10 is a diagram showing the detail of a control apparatus of FIG. 9;

FIGS. 11A and 11B are drawings showing examples of matching databases;

FIG. 17 is an illustrative drawing showing the images of quarter portions of an implemented circuit board together forming the entirety;

DESCRIPTION OF THE PREFERRED EMBODIMENTS

In the following, embodiments of the present invention will be described with reference to the accompanying drawings.

Figure 1:
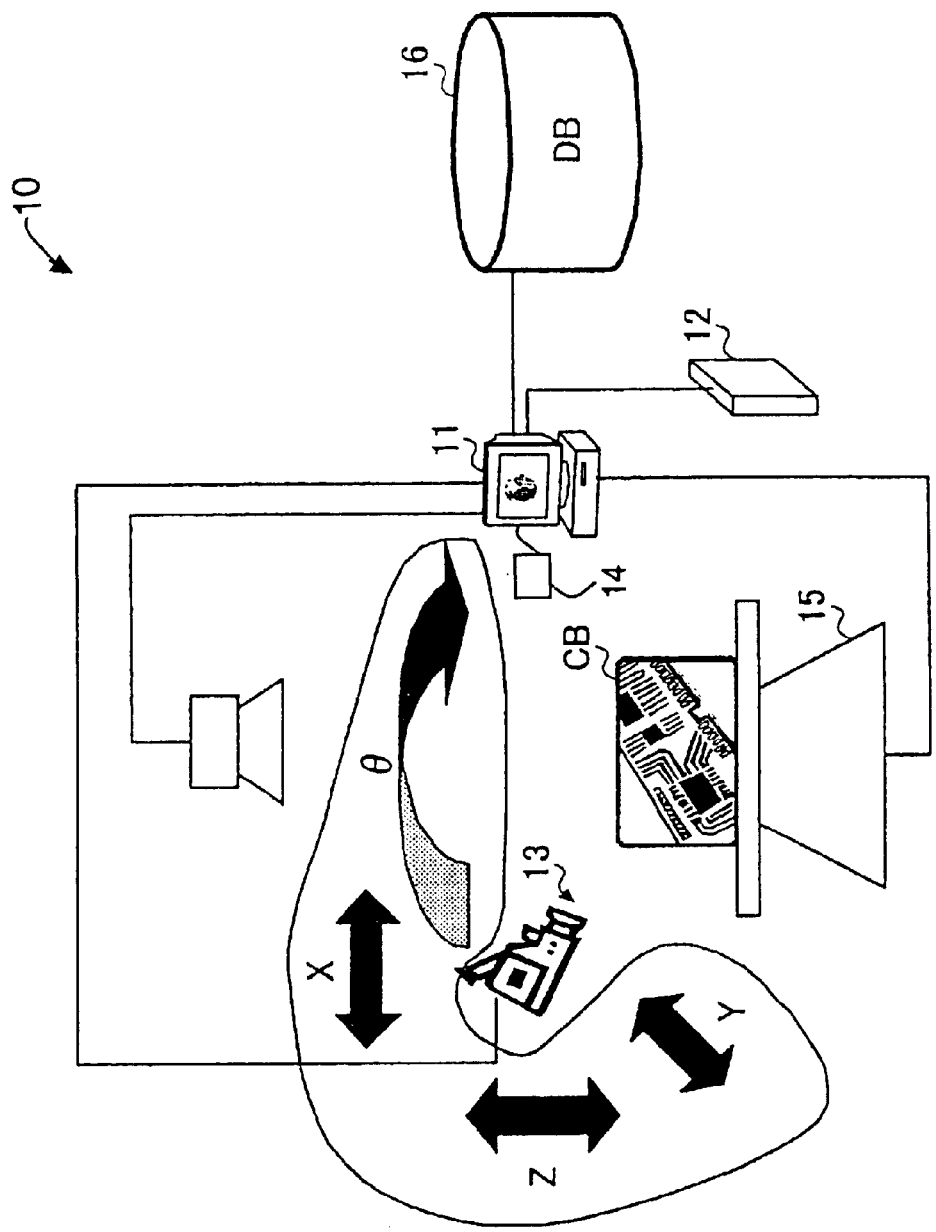
FIG. 1 is an illustrative drawing showing a construction of a system for assessing the environmental load of a circuit board having implemented components.

FIG. 1 is an illustrative drawing showing a construction of a system for assessing the environmental load of a circuit board having implemented components.

An environmental load assessment system 10 of FIG. 1 includes a control apparatus 11 comprised of a computer, a hard-disk drive 12, a camera 13, an X-ray camera 14, a scale 15, and a database 16.

The control apparatus 11 operates according to programs stored in the hard-disk drive 12, and controls the operation of the camera 13 and the X-ray camera 14 so as to acquire the data of visible-range images and the data of X-ray images of a component-implemented circuit board CB. The control apparatus 11 further acquires data indicative of weight of the component-implemented circuit board CB by use of the scale 15 on which the component-implemented circuit board CB is placed. Based on these acquired data, the control apparatus 11 identifies the component-implemented circuit board CB. If the identification of the board is failed, the control apparatus 11 identifies individual components on the component-implemented circuit board CB. The environmental load is then calculated based on the identified data. Various data stored in the database 16 are used during the process of identifying the component-implemented circuit board CB or identifying the individual components and during the process of calculating the environmental load.

In order to achieve such an identification process, the present invention evaluates the type, size, and weight of the component-implemented circuit board CB or individual components mounted on the component-implemented circuit board CB by use of an image-information-based recognition program. The camera 13 can freely be moved around in vertical and horizontal directions under the control of the control apparatus 11, thereby attaining three-dimensional scanning around the component-implemented circuit board CB. This provides image data that is necessary for recognition of the component-implemented circuit board CB or the individual components mounted thereon. There are places such as the inside of a multi-layer substrate or connections beneath the components that cannot be identified through imagery analysis. The X-ray camera 14 is used to obtain information abut such hidden places.

Figure 2:
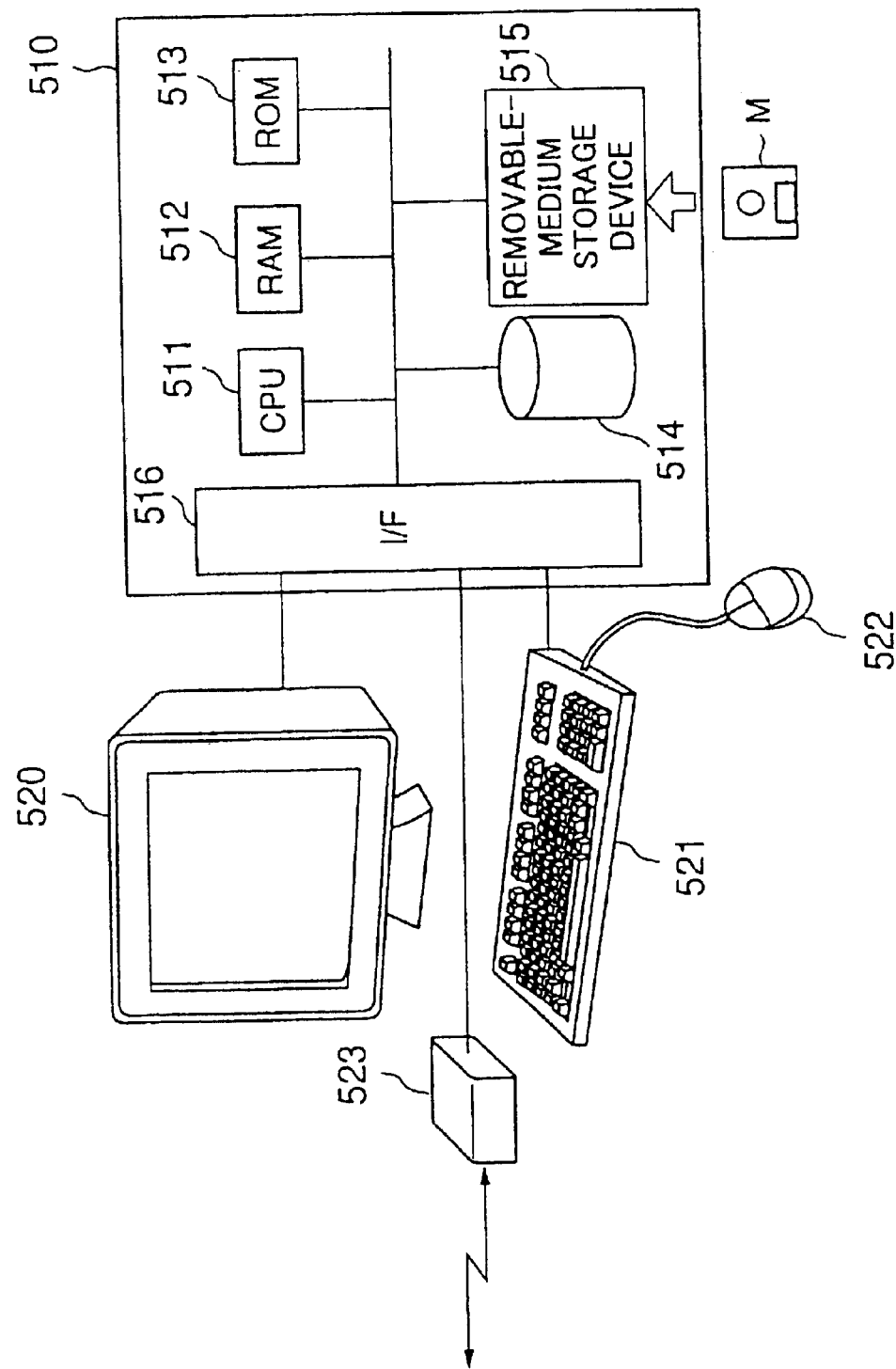
FIG. 2 is a drawing showing the construction of a control apparatus.

FIG. 2 is a drawing showing the construction of the control apparatus 11.

As shown in FIG. 2, the assessment of the environmental load of a circuit board is performed by the control apparatus 11, which is comprised of a computer such as a personal computer, an engineering workstation, or the like. The control apparatus 11 includes a computer 510, a display apparatus 520 connected to the computer 510, a communication apparatus 523, and an input apparatus. The input apparatus includes a keyboard 521 and a mouse 522. The computer 510 includes a CPU 511, a ROM 513, a secondary storage device 514 such as a hard disk, a removable-medium storage device 515, and an interface 516.

The keyboard 521 and mouse 522 provide user interface, and receive various commands for operating the computer 510 and user responses responding to data requests or the like. The display apparatus 520 displays the results of processing by the computer 510, and further displays various data that makes it possible for the user to interact with the computer 510. The communication apparatus 523 communicates with the driver of the camera 13, the driver of the X-ray camera 14, and the scale 15 for control purposes, and acquires necessary image data and weight data.

The method of assessing the environmental load is provided as a computer program executable by the computer 510. This computer program is stored in a memory medium M that is mountable to the removable-medium storage device 515. The computer program is loaded to the RAM 512 or the secondary storage device 514 from the memory medium M through the removable-medium storage device 515. Alternatively, the computer program may be stored in a remote memory medium (not shown), and is loaded to the RAM 512 or the secondary storage device 514 from the remote memory medium through the interface 516.

Upon user instruction for program execution entered through the keyboard 521 and the mouse 522, the CPU 511 loads the program to the RAM 512 from the memory medium M or the secondary storage device 514. The CPU 511 executes the program loaded to the RAM 512 by use of a free space of the RAM 512 as a work area, and continues processing while communicating with the user as a need arises. The ROM 513 stores therein control programs for the purpose of controlling basic operations of the computer 510.

Figure 3:
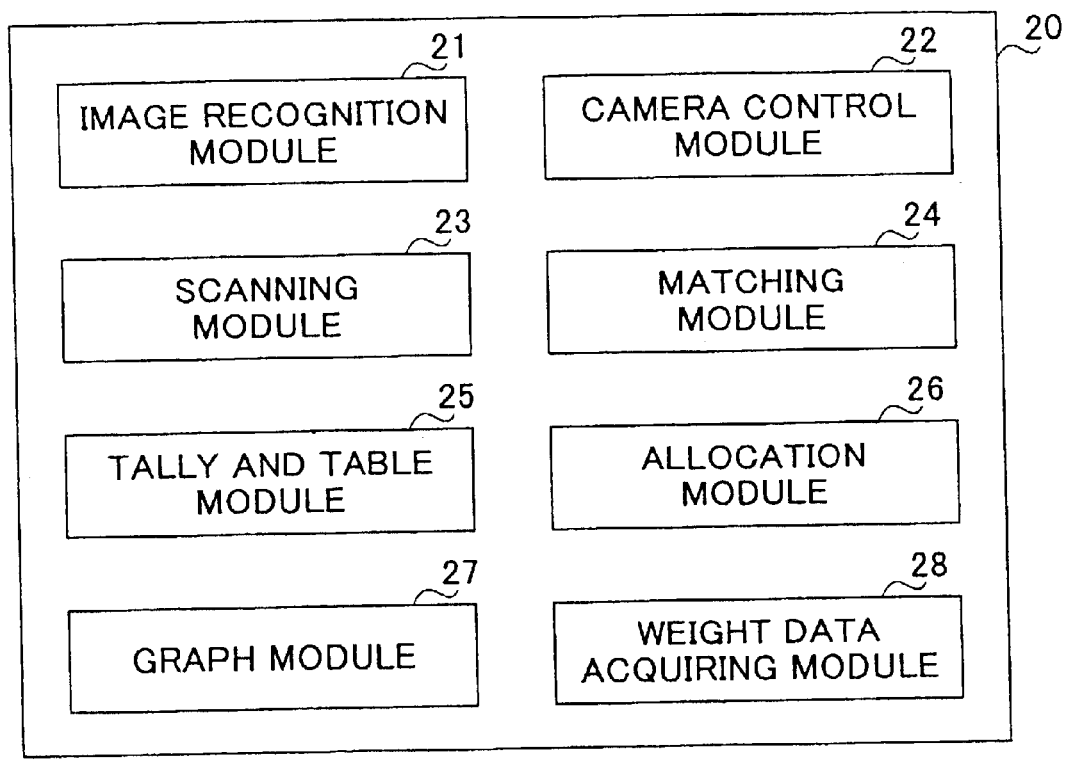
FIG. 3 is a diagram illustrating functional modules of a program for a method of assessing the environmental load.

FIG. 3 is a diagram illustrating functional modules of the program for the method of assessing the environmental load.

A program 20 for the method of assessing the environmental load shown in FIG. 3 includes an image recognition module 21, a camera control module 22, a scanning module 23, a matching module 24, a tally and table module 25, an allocation module 26, a graph module 27, and a weight data acquiring module 28.

The image recognition module 21 analyses images captured by the camera 13 and the X-ray camera 14. The camera control module 22 controls the camera 13 and the X-ray camera 14 to adjust zooming, focusing, and camera positioning for photographing of the component-implemented circuit board CB. The scanning module 23 stores image data in memory inside the computer as the image data is obtained by the camera 13 and the X-ray camera 14. The weight data acquiring module 28 stores weight data in the memory of the computer as the weight data is provided from the scale 15. Based on the results of image recognition, the matching module 24 matches the image data with information stored in the circuit-board database or the component database, thereby identifying the component-implemented circuit board CB or the components mounted thereon.

The tally and table module 25 puts together the data of environmental loads of identified individual components based on the image recognition and the object matching, thereby generating a table sheet. There may be some components on the component-implemented circuit board CB that fail to be recognized and identified. The allocation module 26 allocates environmental loads of these components in view of the data of the recognized and identified components. The graph module 27 displays a graph that shows the data of the environmental loads obtained in respect of the component-implemented circuit board CB.

These modules described above are functional modules of the program that is executed by the computer of the control apparatus 11, and operate as functional units of the control apparatus 11 at the time of execution. In this case, the camera control module 22 and the scanning module 23 may together make up a single functional unit for image acquisition. Further, the image recognition module 21 and the matching module 24 may together constitute a single functional unit for the recognition and matching purpose.

Figure 4:
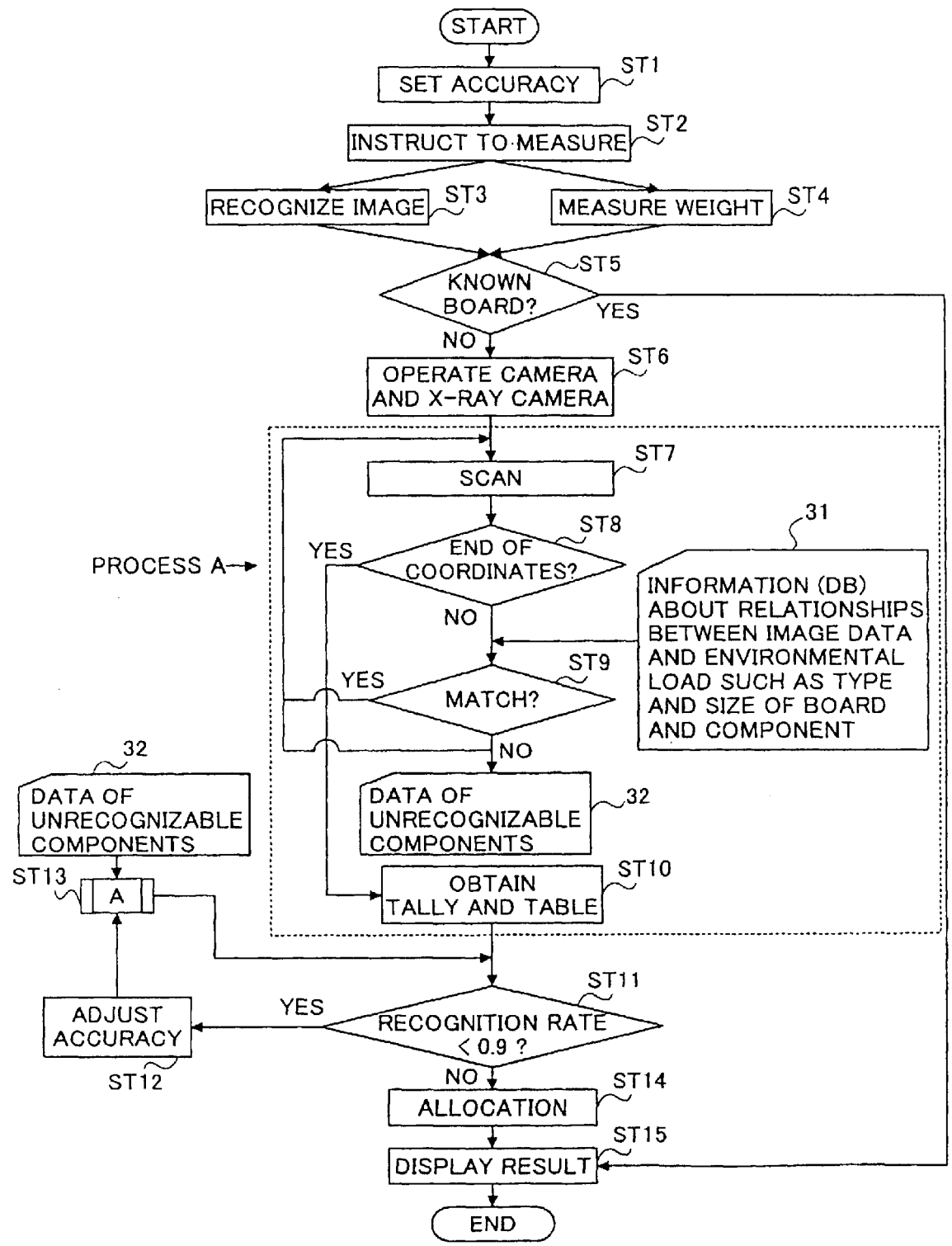
FIG. 4 is a flowchart of a method of assessing the environmental load according to the present invention.

FIG. 4 is a flowchart of a method of assessing the environmental load according to the present invention. This process is performed by the computer of the control apparatus 11.

At step ST1, matching accuracy for the assessment of the environmental load is determined. This is to set up the conditions of matching by specifying the number of matching parameters and the tolerable range of parameters that are ignored when finding a parameter match when the acquired image data is matched with the data of circuit boards or the data of components.

At step ST2, the camera control module 22 sends an instruction to collect data to the camera 13, and the scanning module 23 obtains image data that provide a basis for identifying the overall layout of the component-implemented circuit board CB.

At step ST3, the image recognition module 21 performs an image recognition process on the obtained image data of the component-implemented circuit board CB.

At step ST4, the weight data acquiring module 28 obtains weight data of the component-implemented circuit board CB from the scale 15.

At step ST5, the matching module 24 matches the results of imagery analysis and weight data of the component-implemented circuit board CB with the data of the circuit board database, thereby determining whether the component-implemented circuit board CB matches circuit board data stored in the circuit board database.

FIG. 5 is a drawing showing an example of the circuit board database. As shown in FIG. 5, each circuit board is associated with data indicative of weight, a length, a width, a thickness, a pattern, a manufacturer name, etc. In FIG. 5, the data shown by gray hatching are those used for matching. Other data items such as power, copper, calorific values, $CO_2$, $NO_x$, etc., are environmental loads, which show the amount of resources and energy used to manufacture each circuit board and the amount of waste materials generated at the time of manufacturing.

If the step ST5 finds that the component-implemented circuit board CB subjected to assessment is already registered in the database, the procedure goes on to step ST15, at which the data of environmental loads is displayed. The procedure then comes to an end.

If the step ST5 finds that the component-implemented circuit board CB is not registered in the database, the procedure proceeds to step ST6. In this case, the size of the circuit board and the like are known despite the fact that the recognition of the component-implemented circuit board CB has failed. It is thus possible to obtain data regarding the weight and environmental load of the circuit board itself, excluding the mounted components.

At step ST6, the camera control module 22 controls the operation of the camera 13 and the X-ray camera 14.

At step ST7, the scanning module 23 obtains image data of individual components one by one that are mounted on the circuit board while the camera control module 22 scans the camera 13 (in the XYZ directions and θ direction) around the component-implemented circuit board CB as the need arises. This is done, for example, by scanning in a longitudinal direction from a corner point serving as a start point on the component-implemented circuit board CB, followed by moving in the traverse direction each time a scan in the longitudinal direction comes to an end thereby to repeat the longitudinal scans successively. Further, the X-ray camera 14 is used to acquire image data of hidden pins or the like of the component-implemented circuit board CB, so that information about the arrangement of pins may be used for the recognition purpose. After the acquisition of such image data is completed, additional image information is obtained regarding the amount of solder attached to pins of the components on the circuit board.

At step ST8, a check is made as to whether the scan reaches its end point. If it has not yet reached, the procedure goes to step ST9.

At step ST9, image data obtained in respect of the circuit components are matched with data stored in a component database 31, thereby identifying the circuit components. Further, the amount of solder is evaluated and estimated from the image data of solder. At the time of component matching, imagery analysis by the image recognition module 21 and matching by the matching module 24 are performed.

FIG. 6 is a drawing showing an example of the component database. As shown in FIG. 6, each circuit component is associated with data indicative of a type, colors, a pattern with pin arrangement, a length, a height, a width, a mass, etc. In FIG. 6, the data shown by gray hatching are those used for matching. Other data items such as power, copper, calorific values, $CO_2$, $NO_x$, etc., are environmental loads, which show the amount of resources and energy used to manufacture each circuit component and the amount of waste materials generated at the time of manufacturing.

If the step ST9 finds that the component subjected to assessment is already registered in the database, the procedure goes back to step ST7, and a series of steps including step ST7 and the subsequent steps will be performed with respect to the next component. If the component subjected to assessment is not registered in the database, this component is recorded as unrecognizable component data 32 at step ST9. The procedure then goes back to step ST7, and a series of steps including step ST7 and the subsequent steps will be performed with respect to the next component.

If the step ST8 finds that the scan has reached its end point, the procedure goes to step ST10, at which the data of environmental loads of recognized and identified components are tallied so as to generate a table sheet of environmental loads. This is done by the tally and table module 25.

FIG. 7 is a drawing showing an example of the table sheet. Columns 41 of the table sheet correspond to the respective components that are identified on the component-implemented circuit board CB subjected to assessment. Rows of the table sheet indicate the amount of resources consumed and waste materials generated at the time of manufacture of each component. A component Logic2 identified on the component-implemented circuit board CB, for example, consumed $1.352 \times 10^{-1}$ kg of crude oil as a fuel and $4.653 \times 10^{-3}$ kg of copper ore as a raw material, and generated $6.815 \times 10^{-1}$ kg of $CO_2$ as a waste material. The amount of $CO_2$ exhaustion is added together with respect to all the components on the component-implemented circuit board CB (including the circuit board and the solder), thereby identifying the amount of $CO_2$ emitted at the time of manufacture of the component-implemented circuit board CB. This determines the environmental load in terms of $CO_2$.

After the table sheet is generated, at step ST11 of FIG. 4, a check is made as to whether a recognition rate is smaller than a predetermined recognition rate such as 0.9. Here, the recognition rate is determined based on the mass. The total weight of the component-implemented circuit board CB is measured by the scale 15, and the mass of each recognized and identified component is known from the component database. Then, the total weight of recognized and identified components, the total weight of solder, and the weight of the circuit board itself are added together, followed by calculating a ratio of this obtained sum to the measured weight of the component-implemented circuit board CB. This ratio is the mass ratio of the recognized portion. If this ratio is smaller than 0.9, for example, the procedure goes to step ST12.

At step ST12, accuracy of recognition is set again. This is aimed at improving the recognition ratio by use of less strict conditions of matching than those set at step ST1, by changing the number of parameters and the range of parameters defined such that a match is found if a difference falls within this range. For example, six parameters including the type, colors, pattern, length, height, and width may initially have been used as recognition parameters for matching, and the number of parameters may be reduced so as to use only four parameters including the colors, pattern, length, and the width. A range of ±3% may initially have been set with respect to the length, height, and weight as a tolerable range of matching, and the range may be changed to use a tolerable range of ±5%. Even if recognition accuracy is lowered in this manner, the lowered accuracy is going to be used only for portions remaining after the matching of high accuracy is applied. An effect of use of the lowered accuracy is thus small when the overall recognition accuracy is considered.

After new setting of recognition accuracy, at step ST13, the process of steps ST7 through ST10 (hereinafter referred to as a process A) is performed on the unrecognizable component data 32. Components that are newly recognized through this process are added to the table sheet 40 by the tally and table module 25.

At step ST14, the allocation module 26 carries out an allocation process. In this allocation process, environmental loads of the components that are failed to be recognized and identified are assigned on the component-implemented circuit board CB subjected to assessment where such assignment is done by taking into account the data of the recognized and identified portion. This is equivalent to estimating the environmental load of the unrecognized portion as being similar to those of the recognized portion.

FIG. 8 is a drawing for explaining the allocation process.

In the table shown in FIG. 8, a component field 51 includes a list of components that are recognized and identified by matching process on the component-implemented circuit board CB. A left-hand-side column 52 shows environmental loads of the individual components before the allocation process. A right-hand-side column 53 shows environmental loads of the individual components after the allocation process. A recognized-part field 54 shows sums of respective environmental loads totaled with respect to all the recognized components listed in the component field 51. An unrecognized-part field 55 shows an unrecognized-part weight B that is a difference between the mass A of the recognized-part field 54 and the measured weight. In an example shown in the figure, the mass A of the recognized part is 150 grams whereas the mass B of unrecognized part is 16 grams, and the measured weight is 166 grams.

In the allocation process, each environmental load of each component is increased by a factor of 1+B/A, thereby allocating the environmental load of the unrecognized portion to each component. In the case of the component "Memory1", for example, the weight is 3.1 grams, and the amount of $CO_2$ exhaustion is 8.6 grams. These figures are multiplied by 1.106 (=1+16/150), so that the weight is 3.43 grams and the amount of $CO_2$ exhaustion is 9.52 grams after the allocation process. Since the total mass A is also multiplied by 1+B/A, the total mass after the allocation process will be A+B grams, which corresponds to the actually measured weight.

Through the allocation process described above, the environmental load is obtained for all the portions of the measured weight.

After the allocation process, at step ST15 of FIG. 4, the environment load is displayed as the results of assessment. The graph module 27 may be used to display the environment load in a graph that is easy to recognize visually. The procedure comes to an end.

In this manner, the method of assessing the environmental load according to the present invention obtains image data by cameras and weight data, and refers to the circuit board database or the component database to recognize and identify the component-implemented circuit board CB or individual components mounted thereon. This makes it possible to obtain the environmental load of the component-implemented circuit board CB.

The system for assessing the environment load as described above can attain automatic and speedy assessment of the environmental load of a component-implemented circuit board. If the number of component data entries possessed by the system is small, however, the recognition ratio is bound to fall. Further, this system performs an allocation process on components of the circuit board that were found not to match the component data, i.e., allocates the environmental load of unmatched components to the matched components. If the number of component data entries possessed by the system is small, the number of components to be allocated will increase, resulting in difficulties in accurately assessing the environmental load.

In the following, a description will be given with regard to a system and method for assessing the environmental load that can attain accurate assessment of the environmental load. Such a system is hereinafter referred to as a second scheme of the present invention.

Figure 9:
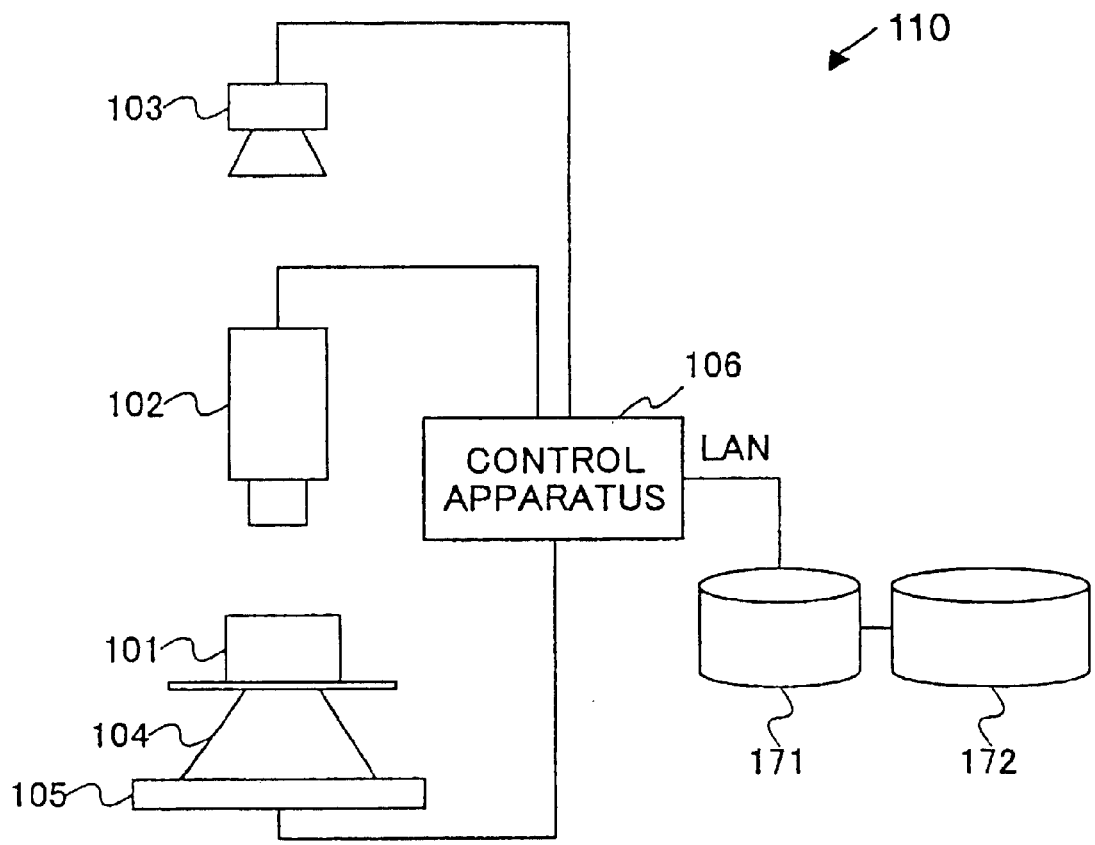
FIG. 9 is a drawing showing the construction of a system for assessing the environmental load of a component-implemented circuit board according to a first embodiment of a second scheme.

FIG. 9 is a drawing showing the construction of a system for assessing the environmental load of a component-implemented circuit board according to a first embodiment of the second scheme.

A environmental load assessment system 110 of FIG. 9 includes a camera (image acquisition unit) 102 fixedly situated above a component-implemented circuit board 101 subjected to assessment (hereinafter referred to simply as a circuit board 101) for capture of image data of the circuit board 101, a lighting apparatus 103 fixedly situated above the circuit board 101 for illuminating the circuit board 101, a scale 104 for measuring the weight of the circuit board 101, a stage 105 on which the scale 104 carrying the circuit board 101 is mounted, and a control apparatus 106 that is connected to the camera 102, the lighting apparatus 103, the scale 104, and the stage 105.

An external storage device such as a magnetic disk drive is connected to the control apparatus 106, and stores therein a matching database 171 and an environmental load database 172. The matching database 171 stores matching-purpose data for component-implemented circuit boards and individual opponents on the circuit board 101, and the environmental load database 172 stores the environmental load data of component-implemented circuit boards and individual components.

FIG. 10 is a diagram showing the detail of the control apparatus 106 of FIG. 9. The control apparatus 106 includes a computer 160, an input device 161 such as a keyboard and a mouse, an output device 162 such as a display and a printer, and a communication device 163 for exchange of programs and data between the computer 160 and other computers connected through a LAN and/or the Internet.

The computer 160 includes a CPU 601 and a RAM 602, which is used as a main memory device to provide a temporary memory area for storage of data and programs executed by the CPU 601 and to provide a work area for the CPU 601. The computer 160 further includes a ROM 603 for storing inerasable programs and data, an auxiliary storage device 604 such as a magnetic disk drive or the like for storing programs and data stored in the RAM 602 as such needs arise, a reading apparatus 605 for reading programs and data recorded in a memory medium M such as a flexible disk or a compact disc, and an interface 606 for providing communication between the CPU 601 and one of the input device 161, the output device 162, and the communication device 163. The CPU 601, the RAM 602, the ROM 603, the auxiliary storage device 604, the reading apparatus 605, and the interface 606 are connected together by a bus so as to communicate with each other.

The control apparatus 106 has a stage driver, which moves the stage 105 in any direction of the three-dimensional space, and rotates the stage 105 around any given axis of the three dimensions. In this embodiment, the camera 102 is fixed while the stage 105 is moved in any direction of the three-dimensional space and rotated around any given axis of the three-dimensional space. Alternatively, the stage 105 may be fixed, and the camera 102 may be moved in any direction of the three-dimensional space and rotated around any given axis of the three-dimensional space.

The lighting apparatus 103 provides a choice of the color of light and also a choice of an illumination angle at which illuminating light is shone on the circuit board 101, with the aim of providing better contrast for components on the circuit board 101. The control apparatus 106 transmits a switch-over signal to the lighting apparatus 103, resulting in a choice of the color of light being either W (white), R (red), G (green), or B (blue), and a choice of an illumination angle being made, selecting whether light is shone from above, from the left-hand side, from the right-hand side, from the front side, or from the rear side.

FIGS. 11A and 11B are drawings showing examples of matching databases. FIG. 11A shows a component matching database, and FIG. 11B shows a circuit-board matching database. As shown in FIG. 11A, the matching database 171 is comprised of a table in which device names, device numbers, and patterns are listed with respect to each electronic device (i.e., components to be mounted on the circuit board 101). As shown in FIG. 11A, such names include Logic IC, Memory, Resistor, Condenser, etc., each of which is associated with device numbers, each of which is further associated with a unique pattern. These patterns are imagery data that is to be matched with the image data of components subjected to assessment. As shown in FIG. 3B, the matching database 171 is comprised of a table in which board names, board numbers, and board patterns are listed. Here, the board name represents the function of the circuit board 101. The patterns are imagery data that is to be matched with the image data of circuit boards subjected to assessment.

After the image data of the circuit board 101 is captured by the camera 102, this image data is matched with the circuit board data of the matching database 171 for identifying the circuit board 101. If the board fails to be identified, individual components on the circuit board 101 are recognized and identified based on the component data of the matching database 171. Based on the data of the identified circuit board 101, the environmental load of the circuit board 101 is then calculated from the environmental load database 172. If there are unidentified components, they are matched with the general pattern shapes of components stored in the matching database 171 as shown in FIG. 11A. The image data of a component subjected to assessment is successively matched with respective items of image data of the matching database 171 so as to compute respective matching rates, and a match is regarded as being found with respect to the image data having attained the highest matching rate with the component subjected to assessment. If the highest matching rate does not exceed a predetermined value (e.g., 60%), such a component is subjected to an allocation process. Here, the allocation process refers to allocation of the environmental load of unidentified components in accordance with the area size of the identified components.

In this embodiment, the stage may be moved only in a two-dimensional plane in order to recognize and identify the shape of the components. If such two-dimensional movement is not sufficient, three-dimensional movement and rotation around each axis may be used to obtain the image data having better contrast. Such better contrast may allow characters on the components to be recognized.

Figure 12:
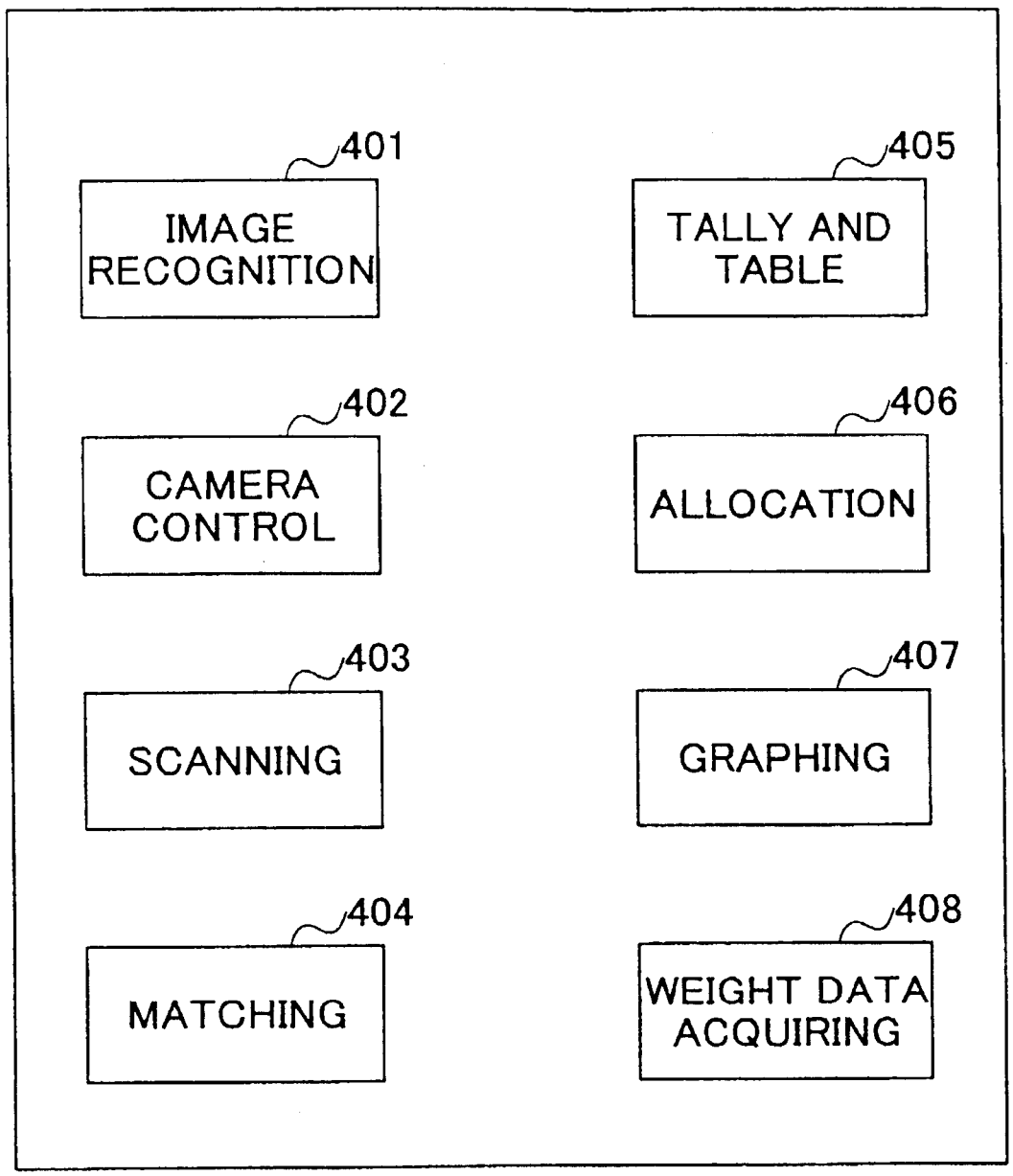
FIG. 12 is a diagram illustrating functional modules of a program for a method of assessing the environmental load.

FIG. 12 is a diagram illustrating functional modules of the program for the method of assessing the environmental load.

A program for the method of assessing the environmental load shown in FIG. 12 includes an image recognition module 401, a camera control module 402, a scanning module 403, a matching module 404, a tally and table module 405, an allocation module 406, a graph module 407, and a weight data acquiring module 408.

The image recognition module 401 analyses images captured by the camera 102.

The camera control module 402 controls the camera 102 to adjust zooming, focusing, and camera positioning for photographing of the circuit board 101.

The scanning module 403 stores image data in the RAM 602 of the computer 160 as the image data is obtained by the camera 102.

The matching module 404 matches the image data with data stored in the circuit-board database or the component database of the matching database by utilizing the outcomes of image recognition, thereby identifying the circuit board 101 or components mounted on the circuit board 101.

The tally and table module 405 puts together the data of environmental loads of identified individual components based on the image recognition and the object matching, thereby generating a table sheet.

The allocation module 406 allocates environmental loads of unidentified and unrecognized components on the circuit board 101 subjected to assessment where such allocation is done in view of the data of the recognized and identified components.

The graph module 407 displays a graph that shows the data of the environmental loads obtained in respect of the circuit board 101.

The weight data acquiring module 408 stores weight data in the RAM 602 of the computer 160 as the weight data is provided from the scale 104.

These modules described above are functional modules of the program that is executed by the CPU 601 of the computer 160, and operate as functional units of the control apparatus 106 at the time of execution. In this case, the camera control module 402 and the scanning module 403 may together make up a single functional unit for image data acquisition. Further, the image recognition module 401 and the matching module 404 may together constitute a single functional unit for the recognition and matching purpose.

In what follows, a description will be given of a method of assessing the environmental load according to the second scheme of the present invention.

Figure 13:
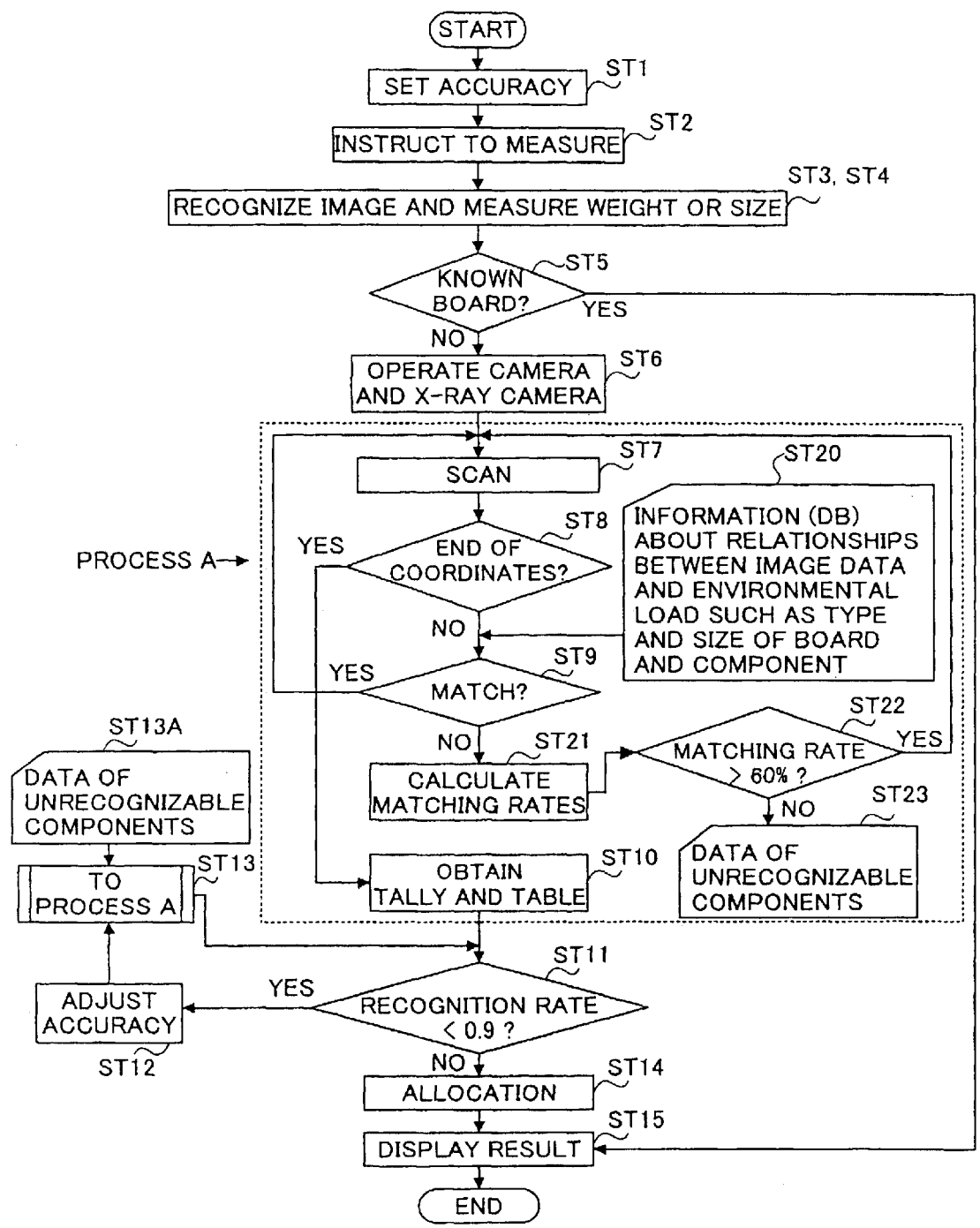
FIG. 13 is a flowchart of a method of assessing the environmental load according to a first embodiment of the second scheme of the present invention.

FIG. 13 is a flowchart of a method of assessing the environmental load according to the first embodiment of the second scheme of the present invention. The system configuration is identical to that shown in FIG. 9, wherein the camera 102 is moved while the stage 105 is fixed.

At step ST1, matching accuracy for the assessment of the environmental load is determined by making initial settings to the accuracy of image recognition. This is to set up the conditions of matching by specifying the number of matching parameters and the tolerable range of parameters that are ignored when finding a parameter match when the acquired image data is matched with the data of circuit boards or the data of components.

At step ST2, the control apparatus 106 starts the measurement of the circuit board 101. The camera control module 402 sends an instruction to collect data to the camera 13, and the scanning module 403 obtains image data that provide a basis for identifying the overall layout of the circuit board 101.

At step ST3, the image data of the entirety of the circuit board 101 is obtained for measurement of the size of the circuit board 101. The image recognition module 401 performs an image recognition process on the image data of the entirety of the circuit board 101.

At step ST4, the weight data acquiring module 408 obtains data indicative of the weight of the circuit board 101 from the scale 104.

At step ST5, a check is made, based on the image data of the entirety of the circuit board 101, as to whether this circuit board has already been processed. In detail, the matching module 404 matches the results of imagery analysis and weight data of the circuit board 101 with the data of the circuit board database, thereby determining whether the circuit board 101 matches circuit board data stored in the circuit board database. If the check result is "YES", the procedure goes to step ST15, at which the results are displayed, followed by the procedure coming to an end. If the check result is "NO", the procedure proceeds to step ST6, at which the camera 102 is operated, and, then, the procedure goes to step ST7. Although only the camera 102 is provided in this embodiment, an X-ray camera may also be provided. This makes it possible to obtain not only the image data of visible portions but also the image data of hidden portions.

At steps ST7, ST8, ST9, ST10, ST21, and ST22, scanning is carried out with respect to each component on the circuit board 101. When the camera 102 detects the end coordinates on the circuit board 101, a tally of data is obtained to produce a table sheet that shows environmental loads. A series of these steps is referred to as a procedure A. In the following, this procedure A will be described.

The control apparatus 106 obtains, from the external storage apparatus, information indicative of the relationships between the environmental loads and the image data such as the type and size of circuit boards and components (step ST20). Items that need to be recognized regarding components (a: shape, b: color, c: type, etc.) are listed, and a check is made as to whether all the listed items can be recognized for the image data obtained by the scan of step ST7. Namely, the processing unit of the control apparatus 106 matches two sets of information in an attempt to recognize the type of each component (as to whether it is a LSI, a register, a condenser, etc.) on the circuit board 101 through pattern recognition (pattern matching: steps ST6, ST7, and ST8).

Environmental loads of the recognized component are then calculated (pattern matching: steps ST6, ST7, and ST8).

At step ST21, unrecognizable image data is matched with general component images to calculate a matching rate.

At step ST22, if a component gives a matching rate exceeding 60%, this component is regarded as being identical to the matched component, and its size is computed. If no component gives a matching rate above 60%, a recognition process is regarded as having failed, and its size is computed, which is then stored in the external storage device of the control apparatus 106 (step ST23). Until the coordinates reaches the end point (step ST8), scan is carried out (step ST7) to repeat the procedure described above. This continues until the end coordinates on the circuit board 101 are detected.

When the step ST10 obtains a tally of data and produces a table sheet, the procedure A comes to an end. At step ST11, a recognition ratio (a ratio of the sum of masses of recognized circuit board and recognized components to the mass of the entirety of the circuit board) is calculated based on the tally of data. If the recognition ratio is less than 0.9, the accuracy of image recognition is lowered (e.g., by reducing the number of items to be recognized from three to two). This change is fed back to the procedure for pattern recognition as described above (steps ST12 and ST13).

If the recognition ratio is no less than 0.9 at step ST11 after repeating this feedback twice, unrecognized data is subjected to an allocation process (step ST14). Final results of the assessment of the environmental load are then displayed as a graphic chart on the display screen (step ST15).

Figure 14:
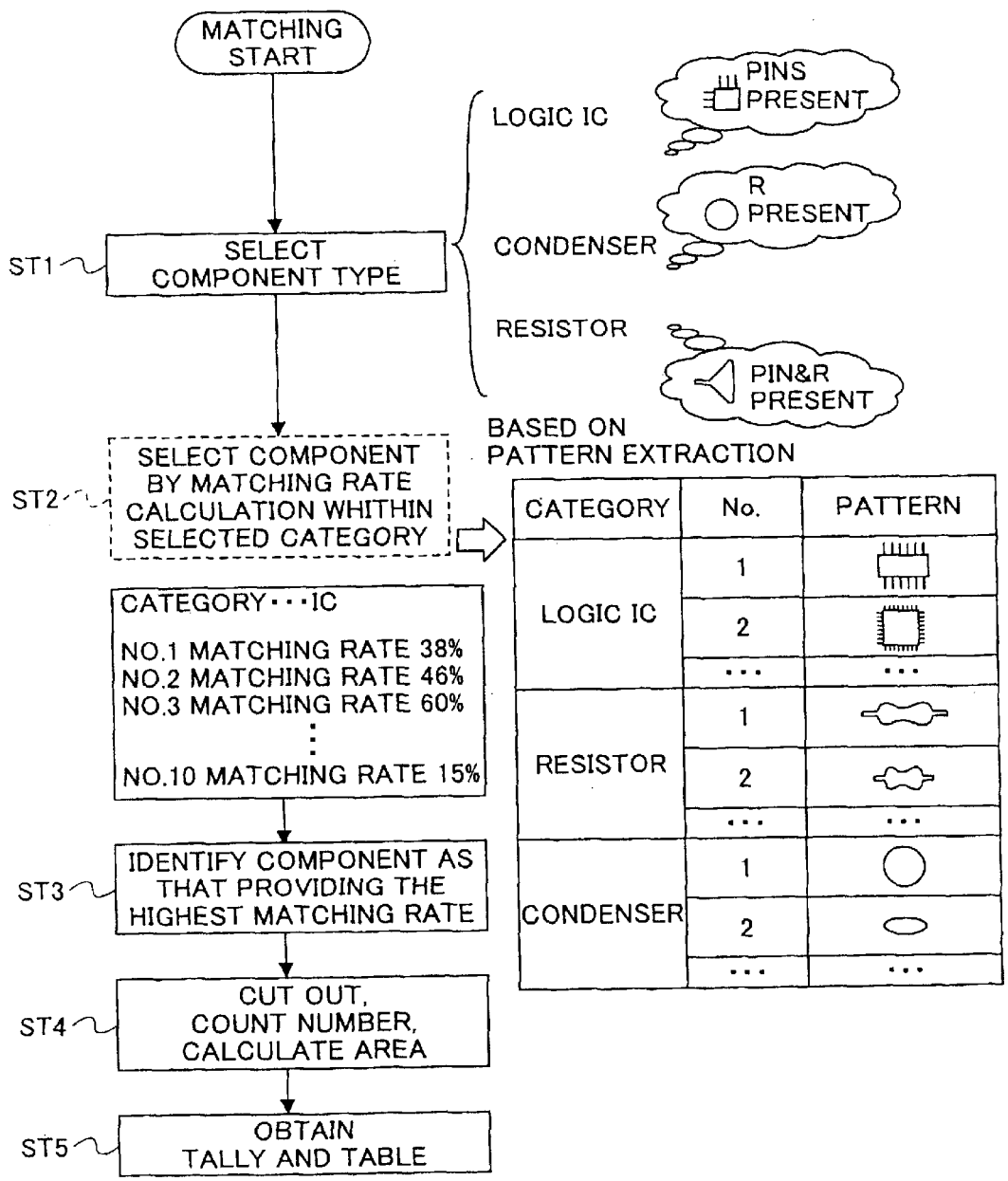
FIG. 14 is a flowchart of matching ratio calculation performed as part of the procedure shown in FIG. 13.
Figure 15A:
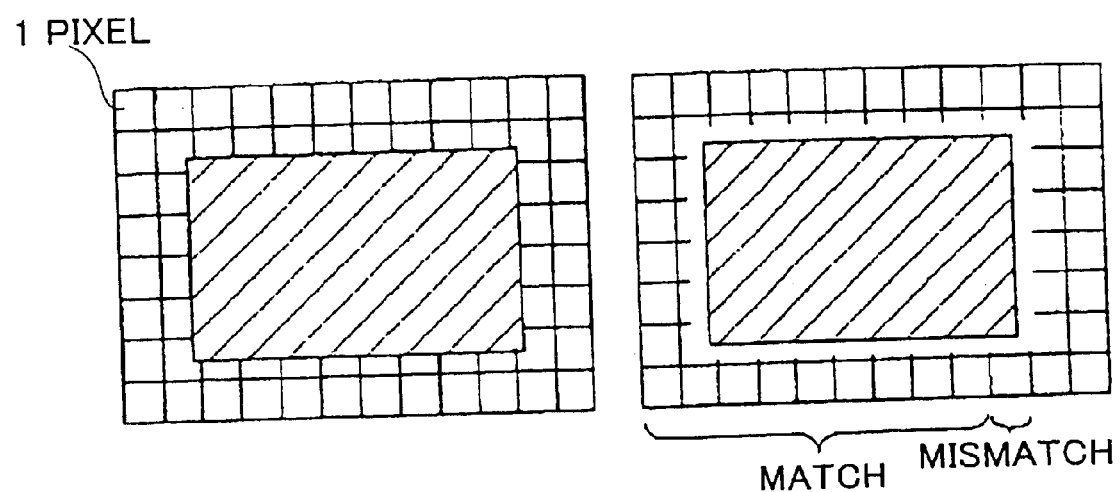
FIGS. 15A and 15B are illustrative drawings for explaining the matching ratio calculation.
Figure 15B:
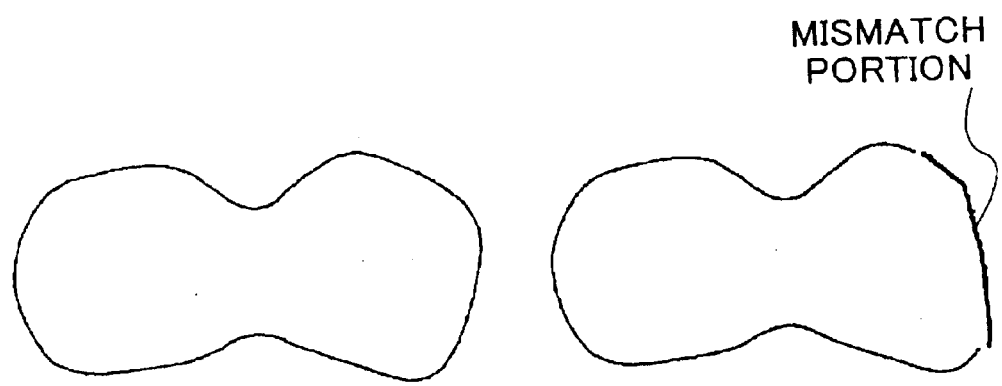

FIG. 14 is a flowchart of the matching ratio calculation performed as part of the procedure A shown in FIG. 13. FIGS. 15A and 15B are illustrative drawings for explaining the matching ratio calculation. FIG. 15A shows an example in which the matching ratio is calculated by checking matches of image data on a pixel-by-pixel basis. FIG. 15B shows an example in which the matching ratio is computed by checking matches of contours.

At step ST1, the type of a component is selected that is subjected to calculation of a matching ratio. This selects one of the logic IC, the memory, the register, the condenser, etc., by choosing a similar pattern from the patterns of the component database of the matching database 171 shown in FIG. 11A.

At step ST2, a matching ratio is calculated with respect to each of the device numbers within the selected category (i.e., selected type). In what follows, an example of matching ratio calculation will be described.

FIG. 15A shows an example in which the matching ratio is calculated by checking matches of image data on a pixel-by-pixel basis. The number of matching pixels and the number of mismatching pixels are counted within a predetermined area of the image data, and the matching ratio is calculated as follows.

Matching Ratio=100*(Number of Matching Pixels/(Number of Matching Pixels+Number of Mismatching Pixels))

FIG. 15B shows an example in which the matching ratio is computed by checking matches of contours. With respect to the total perimeter length TL, the length L1 of the matching portion and the length L2 of the mismatching portion are identified (where TL=L1+L2). The matching ratio is then calculated based on the proportion of the matching portion as follows.

Matching Ratio=100*(L1/(L1+L2))

At step ST3, the component for which matching ratios are calculated is identified as the component that gives the highest matching ratio.

At step ST4, cutting out, counting, and size computation are performed. The term "cutting out" refers to the act of marking the component as one that has already been identified.

At step ST5, a tally of data is obtained, and a table sheet is generated.

In what follows, the cutting out of components will be described.

Figure 16:
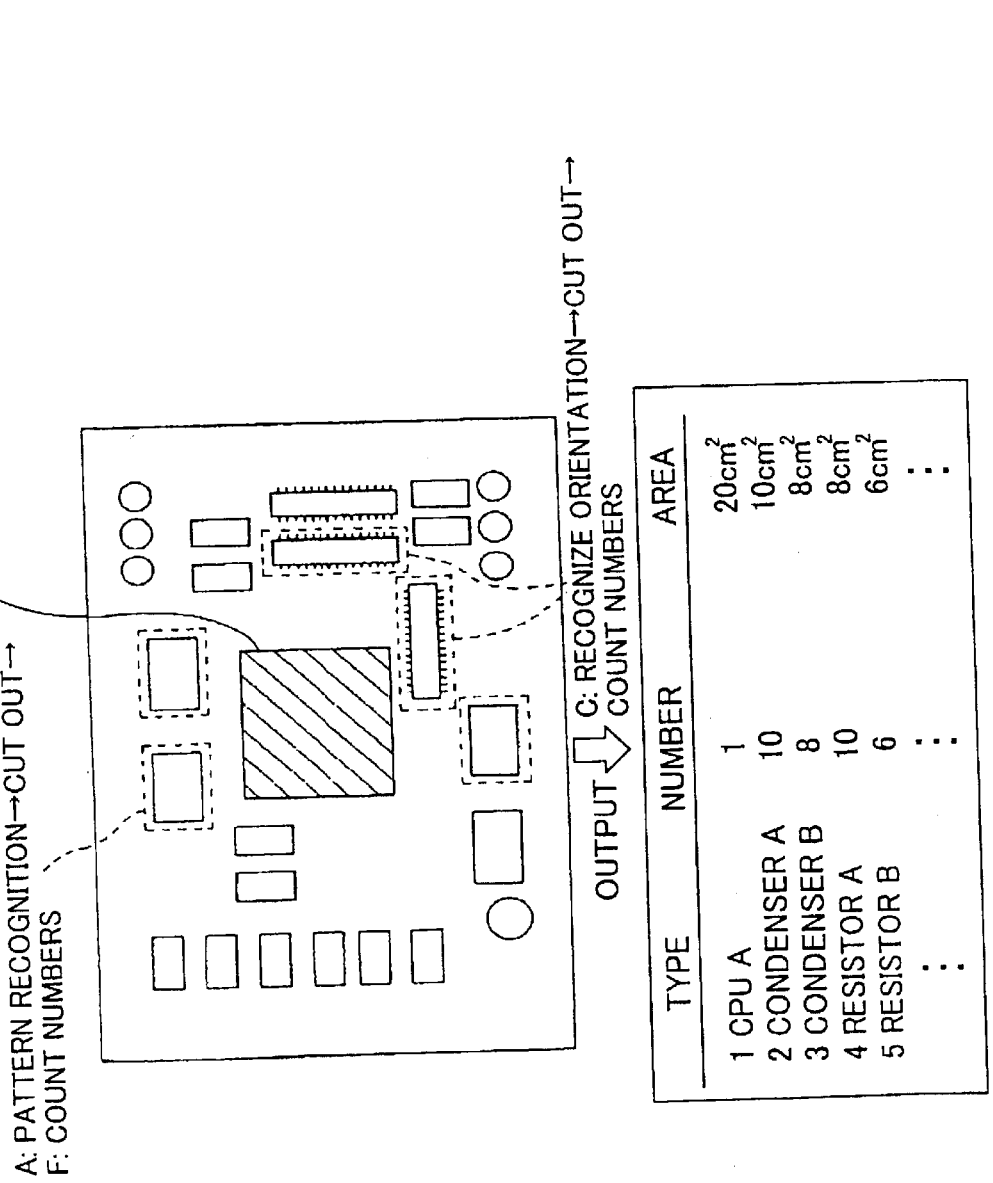
FIG. 16 is an illustrative drawing for explaining a cutting-out process.

FIG. 16 is an illustrative drawing for explaining the cutting-out process. The upper half of the drawing shows a component-implemented circuit board subjected to assessment, and the lower half of the drawing illustrates the results of the cutting-out process. With reference to FIG. 16, a description will be given of the image processing function of the system for assessing the environmental load shown in FIG. 9.

"A: Pattern Recognition" matches the image data of a component with the image data of the matching database. If the component is identified, it is cut out, and the number of identified components with respect to the identified type is counted up. "B: Character Recognition" is performed in the same manner.

When identical components are implemented in different orientations on the circuit board, "C: Orientation Recognition" is performed to cut out the components and count up the number. The area size of the identified components are computed at the same time through the cutting-out process or marking process.

In the following, a description will be given of a case in which the entirety of the circuit board 101 cannot be captured in one image by the camera 102.

FIG. 17 is an illustrative drawing showing the images of quarter portions of the implemented circuit board together forming the entirety. The lower half of the figure illustrates the image of the entirety of the implemented circuit board obtained by merging the four images. The circuit board 101 cannot be processed at once if it is a mother board having a length of 30 cm, for example. In such a case, four images are merged into one image through a merging process.

Figure 18:
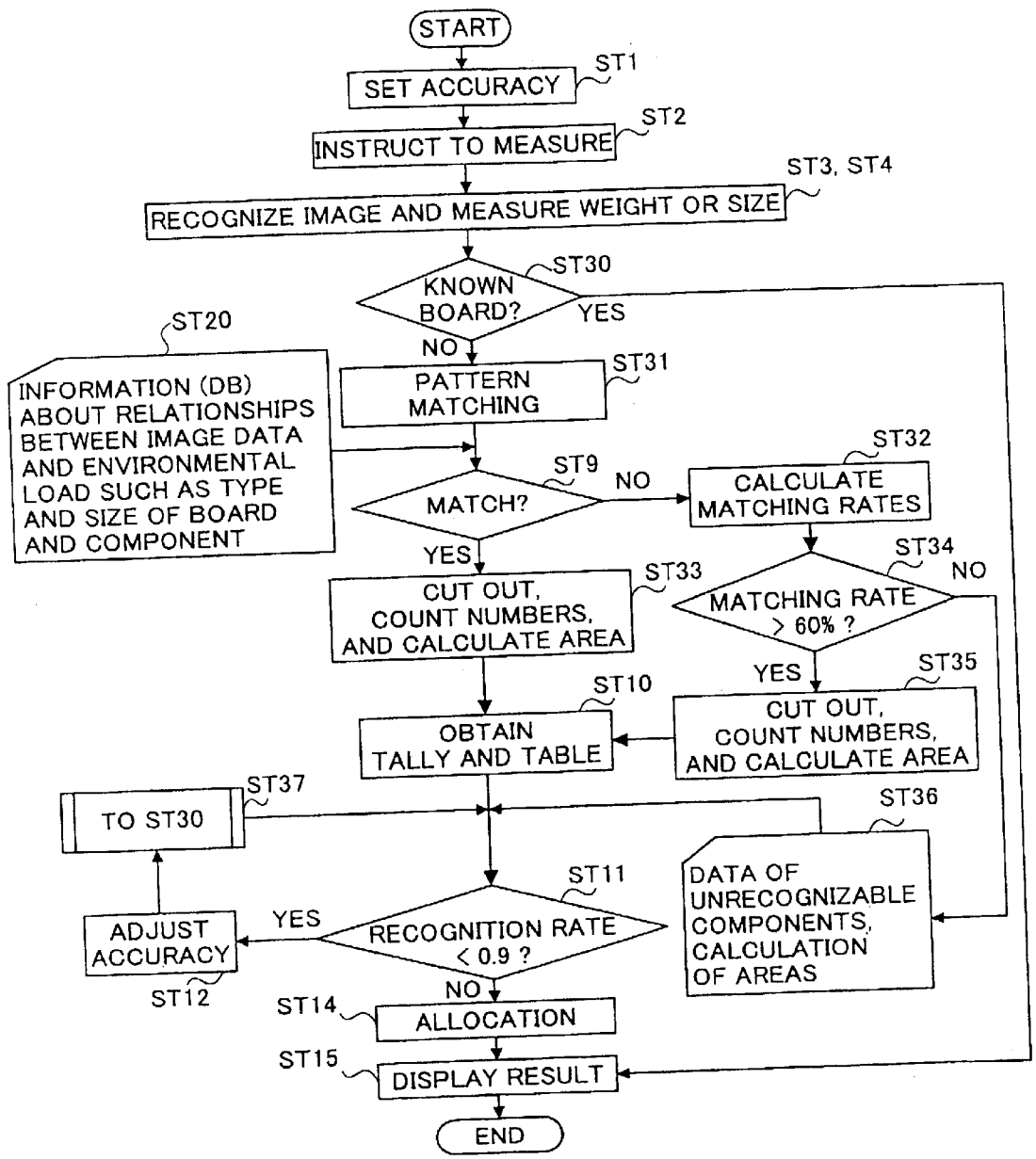
FIG. 18 is a flowchart of a method of assessing the environmental load according to a variation of the first embodiment of the second scheme.

FIG. 18 is a flowchart of a method of assessing the environmental load according to a variation of the first embodiment of the second scheme. This method is based on a simplified version of the environmental load assessment apparatus that uses only two-dimensional image data. The system configuration is the same as that shown in FIG. 9, except that the stage 105 moves while the camera 102 is fixed. In FIG. 18, steps having the same step numbers as those of FIG. 13 perform the same processing, and a description thereof will be omitted.

At step ST30, a check is made, based on the image data of the entirety of the circuit board 101, as to whether the circuit board has already been processed. If the check result is "YES", the procedure goes to step ST15, at which the results are displayed, followed by the procedure coming to an end. If the check result is "NO", the each component on the circuit board 101 is matched (in terms of shapes, characters, angles, etc.) with the image data of the matching database 171 (step ST9). This is done based on the data obtained at step ST20. With respect to components identified at step ST9, the respective numbers are counted up. After the completion of the counting-up process, the area size of these components on the circuit board 101 is computed (step ST33).

Resulting data are stored in the external storage apparatus of the control apparatus 106. The control apparatus 106 then obtains information about relationships between the image data of components and the environmental loads. A tally of data is obtained, and a table sheet is generated (step ST10). Unrecognizable image data (i.e., failed to be recognized at step ST9) is matched with the general component image data stored in the matching database 171, thereby computing matching rates (step ST32).

At step ST34, a component that gives a matching rate above 60% is regarded as being identical to the matched component, so that the number is counted up, and the size is computed (step ST35). Information about relationships between the image data of components and the environmental loads is then obtained from the external storage apparatus. A tally of data is obtained, and a table sheet is generated (step ST10). Remaining components are regarded as unrecognizable components, whose area size is computed and stored in the external storage apparatus of the control apparatus 106 (step ST36).

At step ST11, a recognition ratio (i.e., a ratio of the sum of areas of recognized components to the sum of areas of unrecognized components) is calculated based on the tally of data. If the recognition ratio is less than 0.9, the accuracy of image recognition is lowered (e.g., by reducing the number of items to be recognized from three to two). This change is fed back to the procedure for pattern recognition as previously described (steps ST12 and ST37).

If the recognition ratio is no less than 0.9 after repeating this feedback twice, unrecognized data is subjected to an allocation process (step ST14). Final results of the assessment of the environmental load are then displayed as a graphic chart on the display screen connected to the control apparatus 106 (step ST15).

Figure 19:
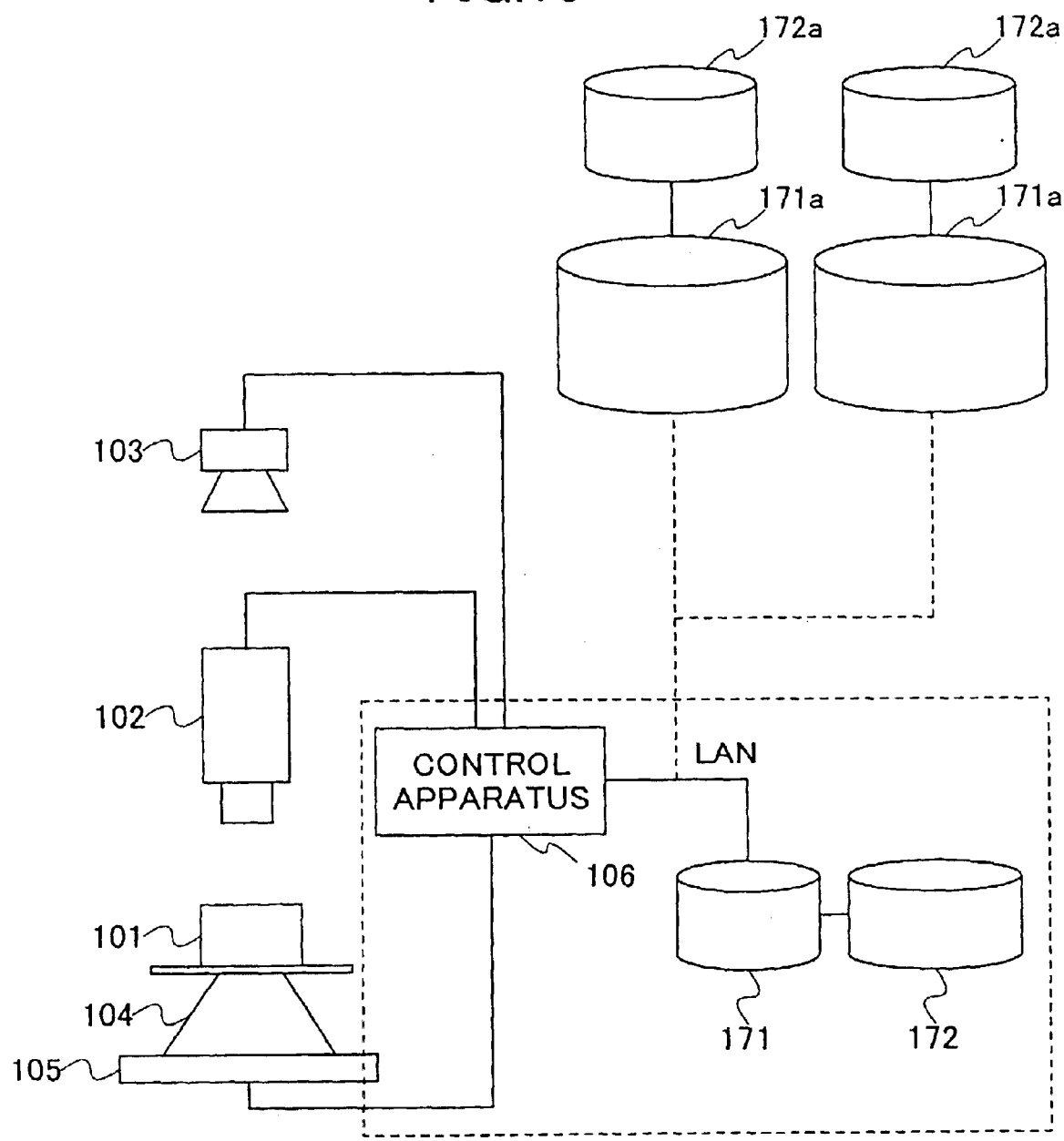
FIG. 19 is a drawing showing the construction of a system for assessing the environmental load of an implemented circuit board according to a second embodiment of the second scheme.

FIG. 19 is a drawing showing the construction of a system for assessing the environmental load of an implemented circuit board according to a second embodiment of the second scheme. The construction is substantially identical to that shown in FIG. 9, except that an external matching database 171a and an external environmental load database 172a are additionally provided.

The camera 102 captures the image data of the circuit board 101, and the circuit board 101 is identified based on the captured image data and the matching database 171. If the circuit board 101 cannot be identified, individual components on the circuit board 101 are recognized for identifying the circuit board 101 based on the component data of the matching database 171. The identification of the circuit board 101 provides a basis for calculating the environmental loads of the circuit board 101 by referring to the environmental load database 172. As for unrecognized components, resembling components are retrieved from the external matching database 171a and the external environmental load database 172a by use of the image data of these components.

Figure 20:
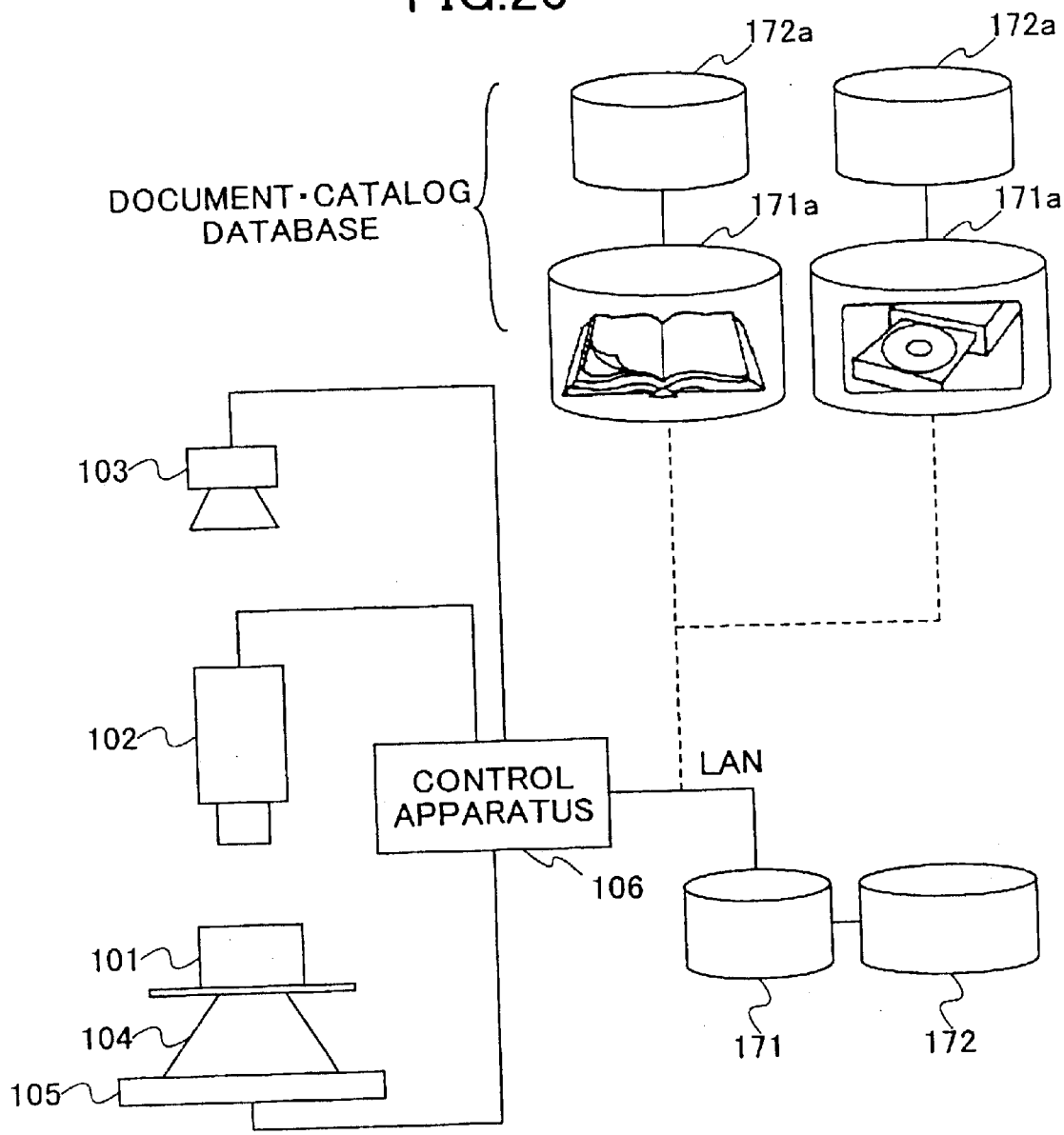
FIG. 20 is a drawing showing the construction of a system for assessing the environmental load of an implemented circuit board according to a variation of the second embodiment of the second scheme.

FIG. 20 is a drawing showing the construction of a system for assessing the environmental load of an implemented circuit board according to a variation of the second embodiment of the second scheme. An example shown in FIG. 12 is directed to a case in which electronic data of documents and catalogs is stored in the external data base (i.e., in the external matching database 171a and the external environmental load database 172a). The documents and catalogs may be read by a scanner for storage in the hard disk such as a magnetic disk or in the record medium such as a CD. Alternatively, paper-based information may be turned into electronic files in the PDF (i.e., portable document format). PDF is a format that defines character fonts and image formats for exchange of document files between computers based on different operation systems.

Figure 21:
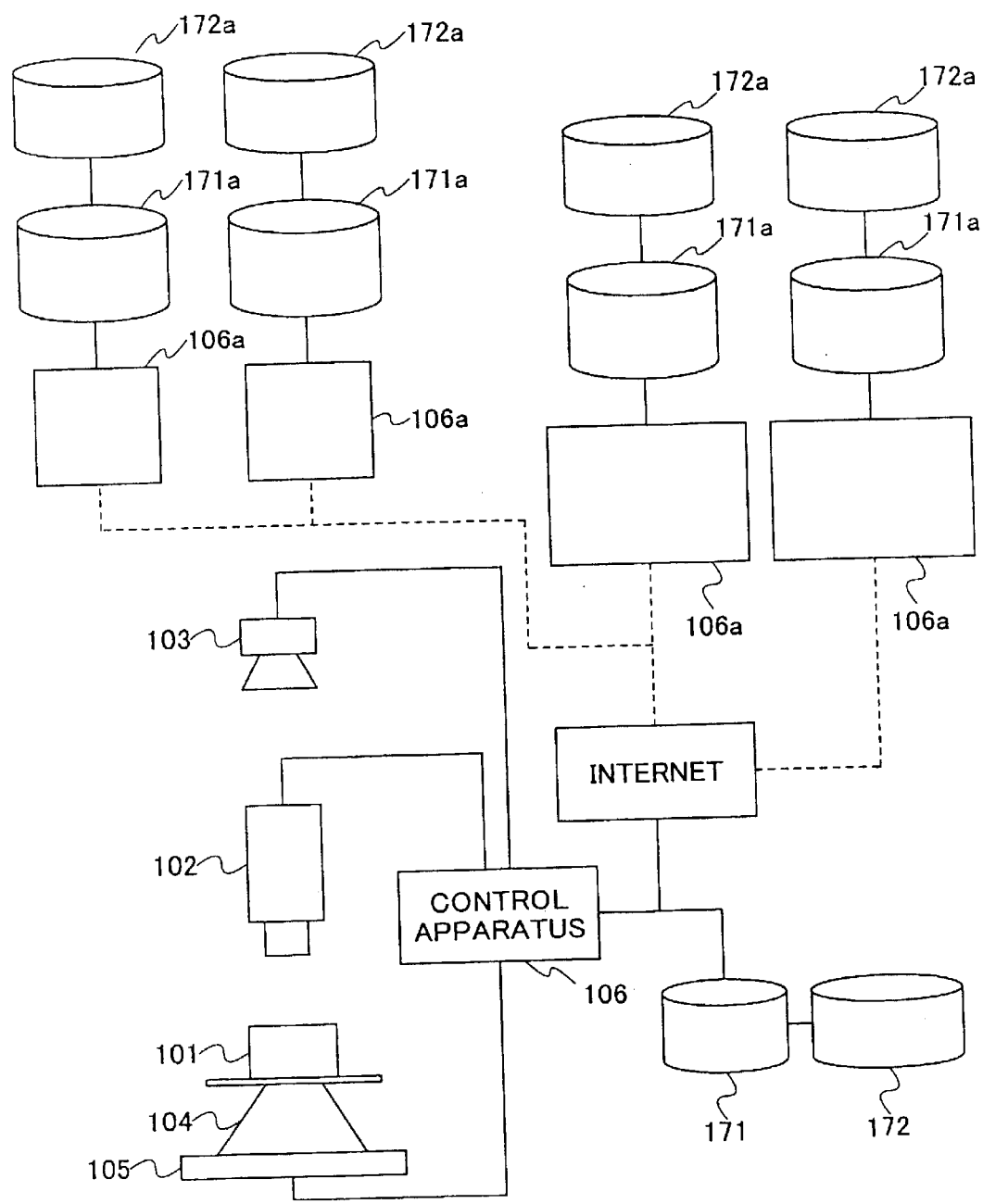
FIG. 21 is a drawing showing the construction of a system for assessing the environmental load of an implemented circuit board according to a further variation of the second embodiment of the second scheme.

FIG. 21 is a drawing showing the construction of a system for assessing the environmental load of an implemented circuit board according to a further variation of the second embodiment of the second scheme. This illustrates a case in which the Internet is used to retrieve an external data base (i.e., the external matching database 171a and the external environmental load database 172a).

Figure 22A:
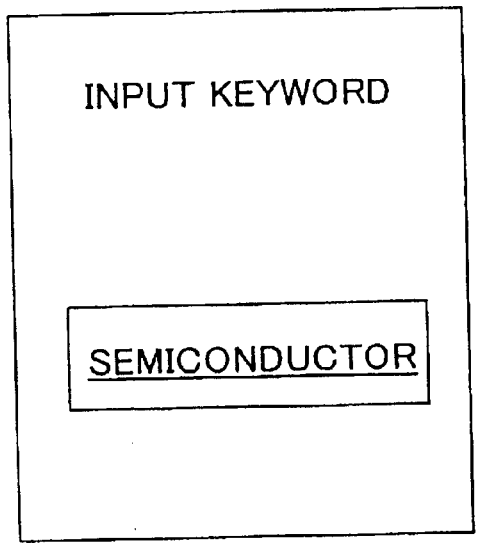
FIGS. 22A and 22B are illustrative drawings showing examples in which image information is retrieved by use of character information.
Figure 22B:
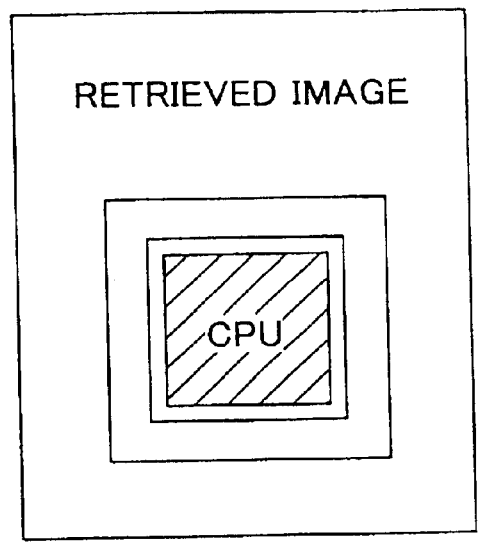

FIGS. 22A and 22B are illustrative drawings showing examples in which image information is retrieved by use of character information. FIG. 22A shows input character data, and FIG. 22B illustrates output image data. These figures demonstrate a schematic example of image retrieval by use of a search engine google (http://images.google.com/). A query keyword "semiconductor device" is entered for search in the site for image information of various semiconductor devices, resulting in an image of a desired semiconductor device being obtained together with related information.

Figure 23A:
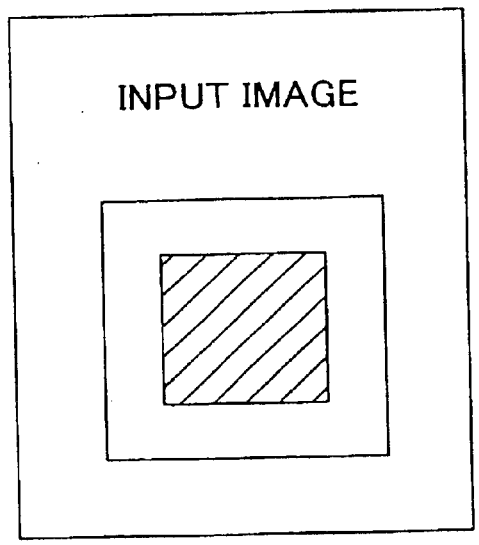
FIGS. 23A and 23B are illustrative drawings showing examples in which image information is retrieved by use of image information.
Figure 23B:
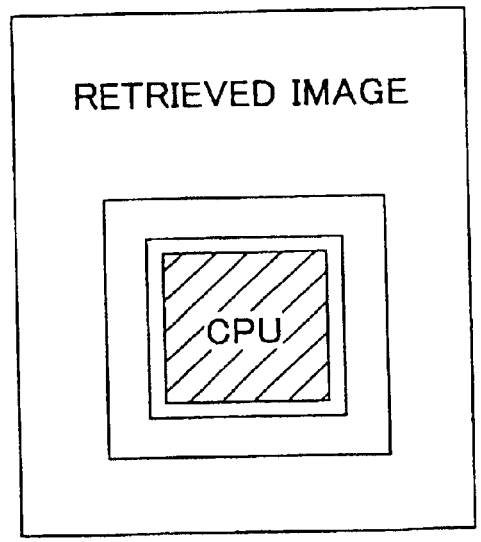

FIGS. 23A and 23B are illustrative drawings showing examples in which image information is retrieved by use of image information. FIG. 23A shows input image data, and FIG. 23B illustrates output image data. These figures demonstrate a schematic example of image retrieval by use of a search engine eVision (http://www.evisionglobal. com/#). An image captured by a camera is entered for search in the site for image information of various semiconductor devices, resulting in an image of a desired semiconductor device being obtained together with related information.

Figure 24:
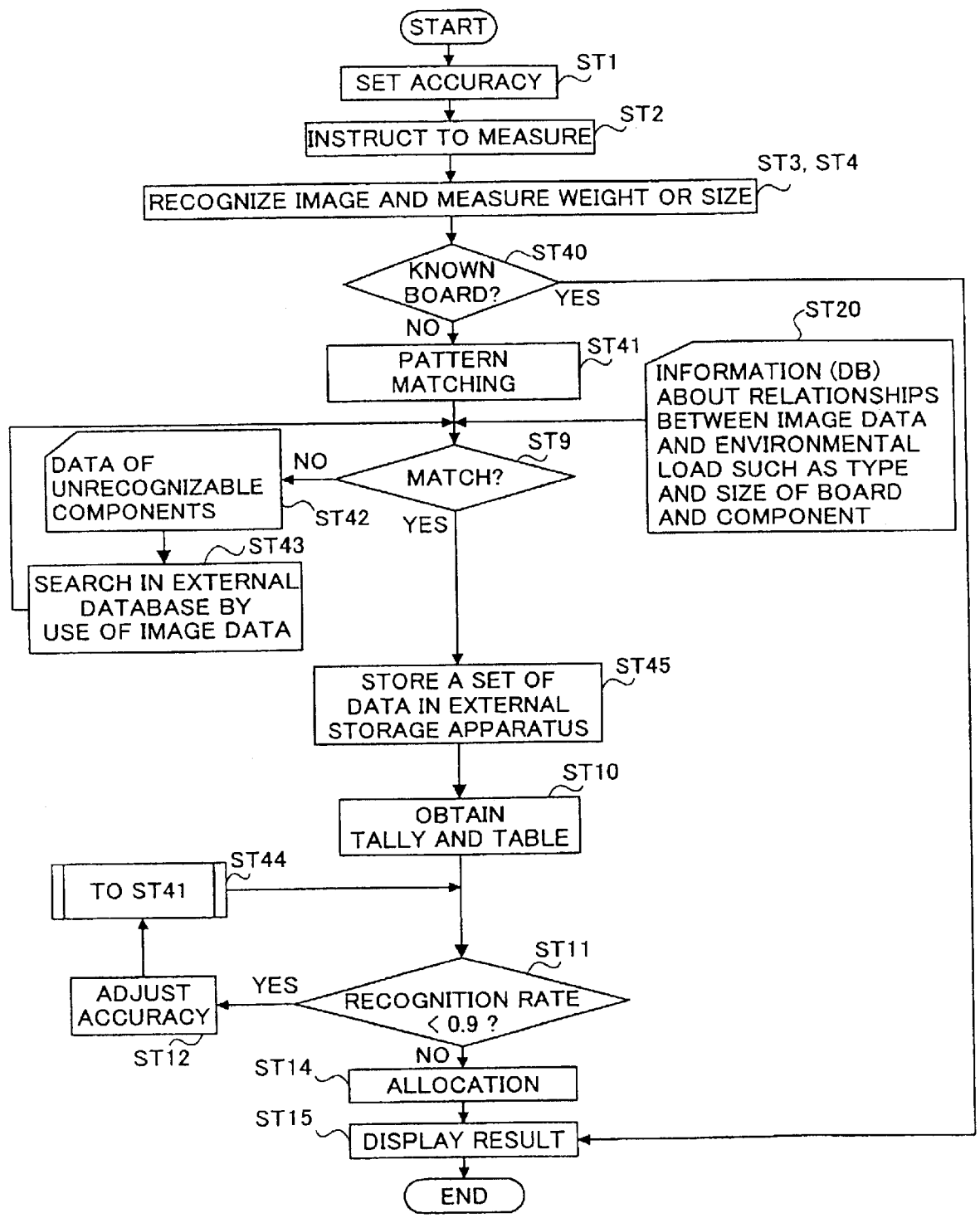
FIG. 24 is a flowchart of a method of assessing the environmental load of an implemented circuit board according to the second embodiment of the second scheme of the present invention.

FIG. 24 is a flowchart of a method of assessing the environmental load of an implemented circuit board according to the second embodiment of the second scheme of the present invention. The system configuration differs from that of FIG. 9 in that the stage 105 moves while the camera 102 is fixed. In FIG. 24, steps having the same step numbers as those of FIG. 13 perform the same processing, and a description thereof will be omitted.

At step ST40, a check is made, based on the image data of the entirety of the circuit board 101, as to whether the circuit board has already been processed. If the check result is "YES", the procedure goes to step ST15, at which the results are displayed, followed by the procedure coming to an end. If the check result is "NO", the procedure goes to step ST41.

At step ST41, each component on the circuit board 101 is matched (in terms of shapes, characters, orientations, etc.) with the image data of the matching database 171. This is done based on the data obtained at step ST20. With respect to identified components, relevant data is stored in the external storage apparatus of the control apparatus 106 (step ST45). Information about relationships between the image data of components and the environmental loads is then retrieved from the external storage apparatus. A tally of data is obtained, and a table sheet is generated (step ST10). Unrecognizable image data that have failed to be identified are matched again by searching the external storage apparatus.

After the completion of generation of the tally and table sheet, a recognition ratio (i.e., a ratio of the sum of masses of the board and recognized components to the mass of the entirety of the circuit board) is calculated based on the tally of data obtained at step ST10. If the recognition ratio is less than 0.9 at step ST11, the accuracy of image recognition is lowered, and this change is fed back to the pattern recognition of step ST41 (steps ST12 and ST44).

If the recognition ratio is no less than 0.9 after repeating this feedback three times, for example, unrecognized data is subjected to an allocation process (step ST14). Final results of the assessment of the environmental load are then displayed as a graphic chart on the display screen connected to the control apparatus 106 (step ST15).

As a further variation, captured image used in the image recognition of the entirety of the board at step ST3 of FIG. 24 may be a three-dimensional image so as to increase image information used for pattern matching. This can improve a recognition rate compared to when only the two-dimensional image is used. As a still further variation, information retrieved from the external storage apparatus with respect to the unrecognizable data in FIG. 24 may be added to (i.e., newly registered in) the internal database, thereby improving the recognition rate.

As a yet further variation, search-purpose database used for pattern matching in FIG. 24 may have its entries classified in advance according to function-based categories (such as the LSI, the register, the condenser, etc.) of components that are generally implemented on a printed circuit board. This makes it possible to search in the category in which device functions resemble each other, which further improves the recognition rate.

Further, the present invention is not limited to these embodiments, but various variations and modifications may be made without departing from the scope of the present invention.

What is claimed is:

1. A system for assessing an environmental load, comprising:
   an image acquisition unit which acquires image data of an image of a component-implemented circuit board subjected to assessment;
   a component database which includes matching-purpose data and environmental load data with respect to a plurality of components; and
   a matching unit which matches the image data with the matching-purpose data of the component database to identify individual components on the component-implemented circuit board subjected to assessment, and extracts the environmental load data belonging to the identified individual components from the component database, thereby obtaining the environmental load of the component-implemented circuit board subjected to assessment.

2. The system as claimed in claim 1, further comprising:
   a weight data acquiring unit which acquires weight data of the component-implemented circuit board subjected to assessment; and
   a circuit-board database which includes matching-purpose data and environmental load data with respect to a plurality of component-implemented circuit boards, wherein the component database comprises the circuit-board database, and
   wherein said matching unit performs a first matching process that matches the image data and the weight data with the matching-purpose data of the circuit-board database to identify the component-implemented circuit board as a whole, and performs a second matching process in response to a failure of the first matching process, said second matching process identifying the individual components on the component-implemented circuit board subjected to assessment.

3. The system as claimed in claim 2, further comprising:
   a camera which captures the image data, wherein the image acquisition unit comprises the camera; and
   a scale which obtains the weight data.

4. The system as claimed in claim 3, further comprising a unit which controls a position of said camera.

5. The system as claimed in claim 1, wherein the image data acquired by said image acquisition unit includes X-ray image data, captured by an X-ray camera, of the component-implemented circuit board subjected to assessment, and said matching unit obtains information about pins from the X-ray image data.

6. A method of assessing an environmental load, comprising the steps of:
   acquiring image data of an image of a component-implemented circuit board subjected to assessment;
   referring to a component database that includes matching-purpose data and environmental load data with respect to a plurality of components, so as to perform a first matching process that matches the image data with the matching-purpose data of the component database for identifying individual components on the component-implemented circuit board subjected to assessment; and
   extracting the environmental load data belonging to the identified individual components from the component database, thereby generating a table sheet regarding the environmental load of the component-implemented circuit board subjected to assessment.

7. The method as claimed in claim 6, further comprising the steps of:
   acquiring weight data of the component-implemented circuit board subjected to assessment;
   referring to a circuit-board database that includes matching-purpose data and environmental load data with respect to a plurality of component-implemented circuit boards, wherein the component database comprises the circuit-board database, so as to perform a second matching process that matches the image data and the weight data with the matching-purpose data of the circuit-board database for identifying the component-implemented circuit board as a whole; and
   extracting the environmental load data belonging to the identified component-implemented circuit board from the circuit-board database in response to the second recognition process succeeding in identifying the component-implemented circuit board, wherein said first matching process is performed in response to the second recognition process failing to identify the component-implemented circuit board.

8. The method as claimed in claim 7, further comprising the steps of:
   obtaining a recognition ratio as a ratio of total masses of the identified individual components to the mass of the weight data; and
   changing settings that are used in the first matching process in response to the recognition ratio failing to exceed a predetermined ratio, followed by repeating the first matching process.

9. The method as claimed in claim 7, further comprising a step of identifying an amount of solder connecting the individual components to the component-implemented circuit board subjected to assessment.

10. The method as claimed in claim 6, wherein the step of acquiring the image data acquires the image data of the individual components by successively scanning the individual components on the component-implemented circuit board subjected to assessment.

11. A system for assessing an environmental load, comprising:
    an image acquisition unit which acquires image data of an image of a component-implemented circuit board subjected to assessment;
    a component database which includes matching-purpose data and environmental load data with respect to a plurality of components;
    a matching unit which matches the image data with the matching-purpose data of the component database to identify individual components on the component-implemented circuit board subjected to assessment;
    a matching rate calculating unit which calculates matching rates between prepared components and a given component if said matching unit fails to identify said given component on the component-implemented circuit board subjected to assessment; and
    an environmental load calculating unit which identifies said given component as being a component giving a highest matching rate among said prepared components, and extracts the environmental load data belonging to the identified individual components inclusive of the given identified component from the component database, thereby obtaining the environmental load of the component-implemented circuit board subjected to assessment.

12. The system as claimed in claim 11, wherein said environmental load calculating unit identifies said given component as being a component giving the highest matching rate among said prepared components if said highest matching rate exceeds a predetermined threshold, and marks said given component as an unidentified component if said highest matching rate fails to exceed the predetermined threshold.

13. The system as claimed in claim 12, further comprising:
    a weight data acquiring unit which measures a weight of the component-implemented circuit board subjected to assessment; and
    an allocation unit which determines environmental loads of unidentified components other than the identified individual components according to the weight of the component-implemented circuit board and a total weight of the identified individual components, and allocates the environmental loads of the unidentified components to the identified individual components.

14. The system as claimed in claim 12, further comprising:
    an area calculating unit which calculates areas of the identified individual components on the component-implemented circuit board subjected to assessment, and calculates areas of unidentified components other than the identified individual components on the component-implemented circuit board subjected to assessment; and
    an allocation unit which determines environmental loads of the unidentified components according to the areas of the identified individual components and the areas of the unidentified components, and allocates the environmental loads of the unidentified components to the identified individual components.

15. The system as claimed in claim 11, further comprising a counting unit which counts a number of the identified individual components with respect to each category of components.

16. A system for assessing an environmental load, comprising:
    an image acquisition unit which acquires image data of an image of a component-implemented circuit board subjected to assessment;
    a component database which includes matching-purpose data and environmental load data with respect to a plurality of components;
    a matching unit which matches the image data with the matching-purpose data of the component database to identify individual components on the component-implemented circuit board subjected to assessment; and
    a retrieval unit which obtains information about a given component from an information source other than said component database if said matching unit fails to identify said given component.

17. The system as claimed in claim 16, wherein said retrieval unit obtains said information through the Internet.

18. The system as claimed in claim 16, wherein said retrieval unit obtains said information from electronic media.

19. The system as claimed in claim 16, wherein said retrieval unit obtains said information by scanning an image on a paper sheet by use of a scanner device.

20. The system as claimed in claim 16, wherein said retrieval unit reads characters printed on the given component, and obtains said information by using the characters as a query.

21. The system as claimed in claim 16, wherein the image data is three-dimensional image data.

22. The system as claimed in claim 16, wherein the matching-purpose data are classified into categories according to functions of the plurality of components.

23. The system as claimed in claim 22, wherein said matching unit matches the image data with the matching-purpose data of the component database only within one of the categories.

24. A method of assessing an environmental load, comprising the steps of:
    providing a component database which includes matching-purpose data and environmental load data with respect to a plurality of components;
    acquiring image data of an image of a component-implemented circuit board subjected to assessment;
    matching the image data with the matching-purpose data of the component database to identify individual components on the component-implemented circuit board subjected to assessment;
    calculating matching rates between prepared components and a given component if said step of matching the image data fails to identify said given component on the component-implemented circuit board subjected to assessment;
    identifying said given component as being a component giving a highest matching rate among said prepared components; and
    extracting the environmental load data belonging to the identified individual components inclusive of the given identified component from the component database, thereby obtaining the environmental load of the component-implemented circuit board subjected to assessment.

25. The method as claimed in claim 24, wherein said step of calculating matching rates identifies said given component as being a component giving the highest matching rate among said prepared components if said highest matching rate exceeds a predetermined threshold, and marks said given component as an unidentified component if said highest matching rate fails to exceed the predetermined threshold.

26. The method as claimed in claim 25, further comprising the steps of:
   measuring a weight of the component-implemented circuit board subjected to assessment; and
   determining environmental loads of unidentified components other than the identified individual components according to the weight of the component-implemented circuit board and a total weight of the identified individual components, and allocates the environmental loads of the unidentified components to the identified individual components.

27. A method of assessing an environmental load, comprising the steps of:
   providing a component database which includes matching-purpose data and environmental load data with respect to a plurality of components;
   acquiring image data of an image of a component-implemented circuit board subjected to assessment;
   matching the image data with the matching-purpose data of the component database to identify individual components on the component-implemented circuit board subjected to assessment; and
   obtaining information about a given component from an information source other than said component database if said step of matching the image data fails to identify said given component.

28. The method as claimed in claim 27, wherein said step of obtaining information obtains said information through the Internet.

* * * * *